United States Patent
Smilde et al.

(10) Patent No.: US 9,946,167 B2
(45) Date of Patent: Apr. 17, 2018

(54) METROLOGY METHOD AND INSPECTION APPARATUS, LITHOGRAPHIC SYSTEM AND DEVICE MANUFACTURING METHOD

(71) Applicant: ASML Netherlands B.V., Veldhoven (NL)

(72) Inventors: Hendrik Jan Hidde Smilde, Veldhoven (NL); Arno Jan Bleeker, Westerhoven (NL); Willem Marie Julia Marcel Coene, Geldrop (NL); Patrick Warnaar, Tilburg (NL); Michael Kubis, Düsseldorf (DE)

(73) Assignee: ASML Netherlands B.V., Veldhoven (NL)

( * ) Notice: Subject to any disclaimer, the term of this patent is extended or adjusted under 35 U.S.C. 154(b) by 403 days.

(21) Appl. No.: 14/824,696

(22) Filed: Aug. 12, 2015

(65) Prior Publication Data

US 2016/0033877 A1 Feb. 4, 2016

Related U.S. Application Data

(62) Division of application No. 13/294,057, filed on Nov. 10, 2011, now Pat. No. 9,140,998.

(Continued)

(51) Int. Cl.
   *G01B 11/00* (2006.01)
   *G03F 7/20* (2006.01)
   *G06N 99/00* (2010.01)

(52) U.S. Cl.
   CPC ...... *G03F 7/70633* (2013.01); *G03F 7/70483* (2013.01); *G03F 7/70625* (2013.01); *G03F 7/70641* (2013.01); *G06N 99/005* (2013.01)

(58) Field of Classification Search
   CPC .... G03F 7/20; G03F 7/70633; G03F 7/70483; G03F 7/70625; G03F 7/70641;
   (Continued)

(56) References Cited

U.S. PATENT DOCUMENTS

| 5,576,829 A * | 11/1996 | Shiraishi | G01N 21/88 356/432 |
|---|---|---|---|
| 6,674,511 B2 | 1/2004 | Nomura et al. | |

(Continued)

FOREIGN PATENT DOCUMENTS

| CN | 101821678 A | 9/2010 |
|---|---|---|
| JP | 2001-267211 A | 9/2001 |

(Continued)

OTHER PUBLICATIONS

"Principal component analysis," Wikipedia, last modified on Nov. 28, 2011, accessed from http://en.wikipedia.org/wiki/Principal_component_analysis on Dec. 1, 2011; 14 pages.

(Continued)

*Primary Examiner* — Jamil Ahmed
(74) *Attorney, Agent, or Firm* — Sterne, Kessler, Goldstein & Fox P.L.L.C.

(57) ABSTRACT

Methods are disclosed for measuring target structures formed by a lithographic process on a substrate. A grating structure within the target is smaller than an illumination spot and field of view of a measurement optical system. The optical system has a first branch leading to a pupil plane imaging sensor and a second branch leading to a substrate plane imaging sensor. A spatial light modulator is arranged in an intermediate pupil plane of the second branch of the optical system. The SLM imparts a programmable pattern of attenuation that may be used to correct for asymmetries between the first and second modes of illumination or imaging. By use of specific target designs and machine- (Continued)

learning processes, the attenuation patterns may also be programmed to act as filter functions, enhancing sensitivity to specific parameters of interest, such as focus.

18 Claims, 9 Drawing Sheets

Related U.S. Application Data

(60) Provisional application No. 61/420,428, filed on Dec. 7, 2010, provisional application No. 61/412,980, filed on Nov. 12, 2010.

(58) Field of Classification Search
CPC ...... G06N 99/00; G06N 99/005; G01N 21/00; G01N 21/88; G01N 21/47
See application file for complete search history.

(56) References Cited

U.S. PATENT DOCUMENTS

| | | | |
|---|---|---|---|
| 6,762,111 B2 | 7/2004 | Fukuda | |
| 6,961,116 B2 | 11/2005 | Den Boef et al. | |
| 7,053,390 B2 | 5/2006 | Shiraishi | |
| 7,332,732 B2 | 2/2008 | Van Bilsen et al. | |
| 7,433,039 B1 | 10/2008 | Levinski et al. | |
| 7,528,941 B2 | 5/2009 | Kandel et al. | |
| 7,656,518 B2 | 2/2010 | Den Boef et al. | |
| 7,791,727 B2 | 9/2010 | Den Boef et al. | |
| 7,911,612 B2 | 3/2011 | Kiers et al. | |
| 8,411,287 B2 | 4/2013 | Smilde et al. | |
| 8,867,020 B2 | 10/2014 | Smilde et al. | |
| 9,140,998 B2 | 9/2015 | Smilde et al. | |
| 2003/0143761 A1 | 7/2003 | Fukuda | |
| 2006/0109435 A1 | 5/2006 | Bleeker | |
| 2006/0132807 A1 | 6/2006 | Abdulhalim et al. | |
| 2006/0245092 A1 | 11/2006 | Kuiper et al. | |
| 2008/0055609 A1 | 3/2008 | Finarov et al. | |
| 2010/0069757 A1* | 3/2010 | Yoshikawa | A61B 5/02007 600/454 |
| 2010/0201963 A1 | 8/2010 | Cramer et al. | |
| 2010/0231883 A1 | 9/2010 | Dodoc et al. | |
| 2010/0328655 A1* | 12/2010 | Den Boef | G03F 7/70633 356/237.5 |
| 2011/0027704 A1 | 2/2011 | Dodoc et al. | |
| 2011/0043791 A1 | 2/2011 | Smilde et al. | |
| 2012/0044470 A1 | 2/2012 | Smilde et al. | |
| 2012/0113404 A1 | 5/2012 | Hsu et al. | |
| 2012/0123581 A1 | 5/2012 | Smilde et al. | |
| 2012/0242970 A1 | 9/2012 | Smilde et al. | |
| 2014/0204397 A1 | 7/2014 | Smilde et al. | |

FOREIGN PATENT DOCUMENTS

| | | |
|---|---|---|
| JP | 2003-224057 A | 8/2003 |
| JP | 2005-268237 A | 9/2005 |
| JP | 2008-311645 A | 12/2008 |
| JP | 2009-204621 A | 9/2009 |
| WO | WO 2009/078708 A1 | 6/2009 |
| WO | WO 2009/106279 A1 | 9/2009 |
| WO | WO 2010/069757 A1 | 6/2010 |
| WO | WO 2010/076232 A2 | 7/2010 |
| WO | WO 2010/130600 A1 | 11/2010 |
| WO | WO 2011/023517 A1 | 3/2011 |

OTHER PUBLICATIONS

International Search Report with the Written Opinion of the International Searching Authority directed to related International Patent Application No. PCT/EP2011/069845, dated Feb. 7, 2012, from the European Patent Office; 11 pages.
International Search Report with the Written Opinion of the International Searching Authority directed to related International Patent Application No. PCT/EP2011/066038, dated Feb. 6, 2012, from the European Patent Office; 14 pages.
Notice of Allowance dated Nov. 22, 2013 for U.S. Appl. No. 13/235,902, filed Sep. 19, 2011; 12 pages.
Notice of Allowance dated Feb. 21, 2014 for U.S. Appl. No 13/235,902, filed Sep. 19, 2011; 8 pages.
Notice of Allowance dated May 5, 2014 for U.S. Appl. No. 13/235,902, filed Sep. 19, 2011; 7 pages.
Notice of Allowance dated Jun. 20, 2014 for U.S. Appl. No. 13/235,902, filed Sep. 19, 2011; 7 pages.
Non-Final Rejection dated Nov. 14, 2014 for U.S. Appl. No. 13/294,057, filed Nov. 10, 2011; 10 pages.
Notice of Allowance dated May 14, 2015 for U.S. Appl. No. 13/294,057, filed Nov. 10, 2011; 13 pages.
Notice of Allowance dated Jul. 17, 2015 for U.S. Appl. No. 13/294,057, filed Nov. 10, 2011; 8 pages.
Notice of Allowance dated Aug. 20, 2015 for U.S. Appl. No. 13/294,057, filed Nov. 10, 2011; 8 pages.
English-language abstract for Japanese Patent Publication No. 2001-267211 A, published Sep. 28, 2001; 2 pages.
Notice of Allowance dated Nov. 4, 2016, for U.S. Appl. No. 14/224,532, filed Mar. 25, 2014; 8 pages.

* cited by examiner

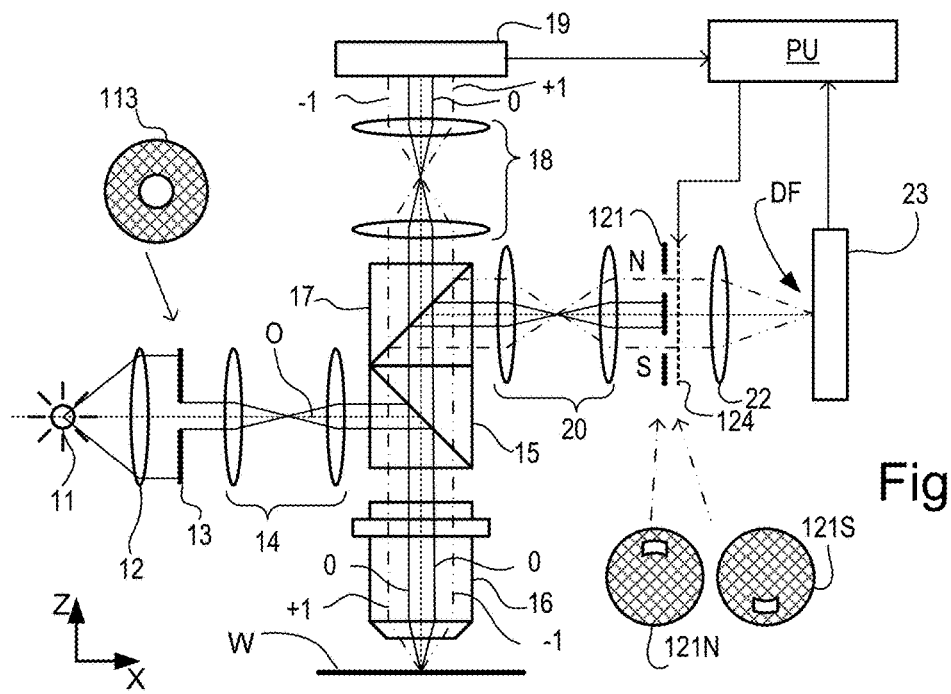
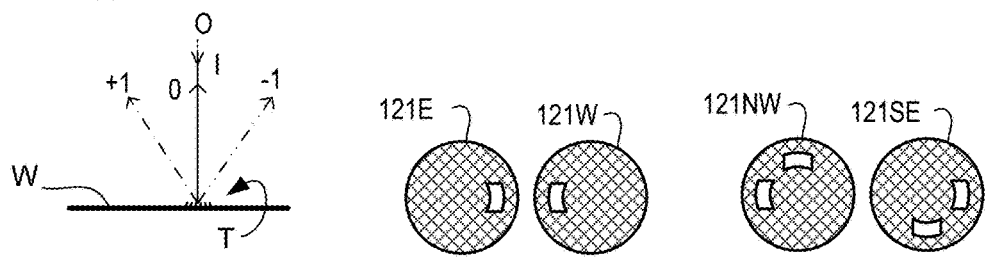
Fig. 8b   Fig. 8c   Fig. 8d
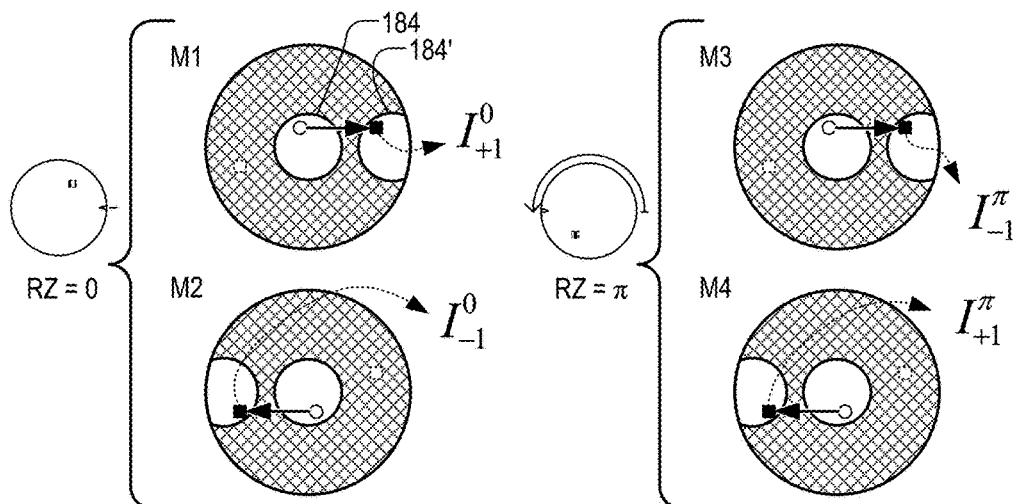
Fig. 9

METROLOGY METHOD AND INSPECTION APPARATUS, LITHOGRAPHIC SYSTEM AND DEVICE MANUFACTURING METHOD

This application incorporates by reference in their entireties U.S. patent application Ser. No. 13/294,057, filed Nov. 10, 2011 and U.S. Provisional Patent Application No. 61/420,428, filed Dec. 7, 2010 and U.S. Provisional Patent Application No. 61/412,980, filed Nov. 12, 2010.

BACKGROUND

Field of the Invention

The present invention relates to methods and apparatus for metrology usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

In the known dark-field metrology technique, best overlay measurement results are obtained if the target is measured twice under certain conditions, while the wafer is rotated to obtain the −1 and the +1 diffraction order intensities in turn. The use of exactly the same optical path for both measurements ensures that any difference between the measured intensities is due to target properties, not properties of the instrument. On the other hand, the requirement to rotate the target, which may be on a large substrate, makes the process slow and the apparatus potentially more complex.

SUMMARY

It is desirable to provide a method and apparatus for dark field metrology, for example to measure asymmetry and/or overlay in target gratings, in which throughput and accuracy can be improved over prior published techniques.

The invention in a first aspect provides a method of measuring asymmetry in a periodic structure formed by a lithographic process on a substrate, the method comprising the steps of using the lithographic process to form a periodic structure on the substrate, a first measurement step comprising forming and detecting a first image of the periodic structure while illuminating the structure with a first beam of radiation, the first image being formed using a first selected part of diffracted radiation, a second measurement step comprising forming and detecting a second image of the periodic structure while illuminating the structure with a second beam of radiation, the second image being formed using a second selected part of the diffracted radiation which is symmetrically opposite to the first part, in a diffraction spectrum of the periodic structure, and using a difference in intensity values derived from the detected first and second images together to determine the asymmetry in the profile of the periodic structure, wherein the optical system further comprises a spatial light modulator which is controlled to apply a varying non-binary optical attenuation over the first and second selected parts of the diffracted radiation prior to forming the first and second images respectively.

In some embodiments, the first and second measurement steps are performed without rotating the substrate using different optical paths within a measurement optical system, and wherein the varying optical attenuation is configured to reduce an influence on the determined property of the difference in optical paths between the first and second measurement steps.

Calibration measurements to determine the varying attenuation pattern can be performed using a calibration target. Calibration measurements may involve rotation of the calibration target. The calibration target may have a periodic structure larger than a field of view of the measurement optical system.

In some embodiments, the varying optical attenuation implements a first and second filter functions for the respective measurement step, the filter functions being calculated to enhance sensitivity of the calculated difference to a property of interest. In certain embodiments, the filter functions are calculated such that the calculated difference is related directly to the performance parameter of the lithographic process, for example focus, rather than a feature of the periodic structure itself.

The method in some embodiments is performed on in several periodic structures simultaneously, using structures are small enough to all fit within a field of view of the measurement optical system. This field of view may be defined for example by an illumination spot size. The first and second images may be obtained using different modes of illumination, and/or different modes of imaging.

In one embodiment, the measurement optical system comprises a first optical branch and image sensor for forming and detecting calibration images in a plane conjugate with a pupil plane of an objective lens of the optical system, and a second optical branch and image sensor for forming and detecting the first and second images in a plane conjugate with a plane of the substrate, the spatial light modulator being positioned in an intermediate pupil plane of the second branch.

The invention further provides an inspection apparatus configured for measuring asymmetry in a periodic structure on a substrate, the inspection apparatus comprising an illumination arrangement operable to deliver conditioned beams of radiation to the substrate for use in measurement steps, a detection arrangement operable during such measurement steps to form and detect respective images of the substrate using radiation diffracted from the substrate the illumination arrangement and the detection arrangement forming a measurement optical system, and a stop arrangement within the detection arrangement, wherein the illumination arrangement and stop arrangement together are operable to select which part of a diffraction spectrum of the diffracted radiation contributes to each image, and wherein the detection arrangement further comprises a spatial light modulator operable to apply a varying optical attenuation over the selected part of the diffracted radiation prior to forming the first and second images respectively.

The apparatus may be used to implement the method of the invention, as set forth above.

The invention further provides a lithographic system including a lithographic apparatus and an inspection apparatus according to the invention, as set forth above.

The invention further provides a method of manufacturing devices wherein a device pattern is applied to a series of substrates using a lithographic process, the method including inspecting at least one periodic structure formed as part of or beside the device pattern on at least one of the substrates using an inspection method according to the invention as set forth above, and controlling the lithographic process for later substrates in accordance with the result of the inspection method.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIGS. 3a-3d comprises 3a a schematic diagram of an inspection apparatus according to a first embodiment of the invention, 3b a detail of diffraction spectrum of a target grating for a given direction of illumination 3c a second pair of illumination apertures providing further illumination modes in using the scatterometer for diffraction based overlay measurements and 3d a third pair of illumination apertures combining the first and second pair of apertures.

Figure 4:
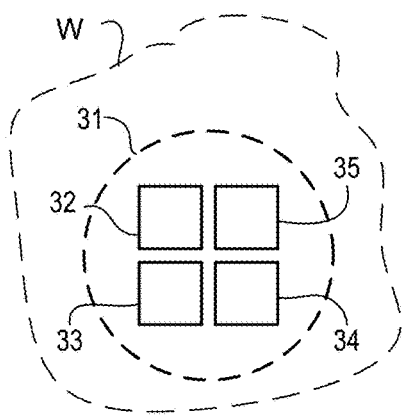

FIG. 4 depicts a known form of target and an outline of a measurement spot on a substrate.

Figure 5:
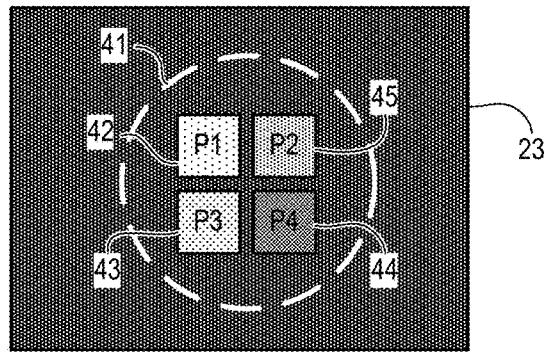

FIG. 5 depicts an image of the targets of FIG. 4 obtained in the scatterometer of FIGS. 3a-3d.

Figure 6:
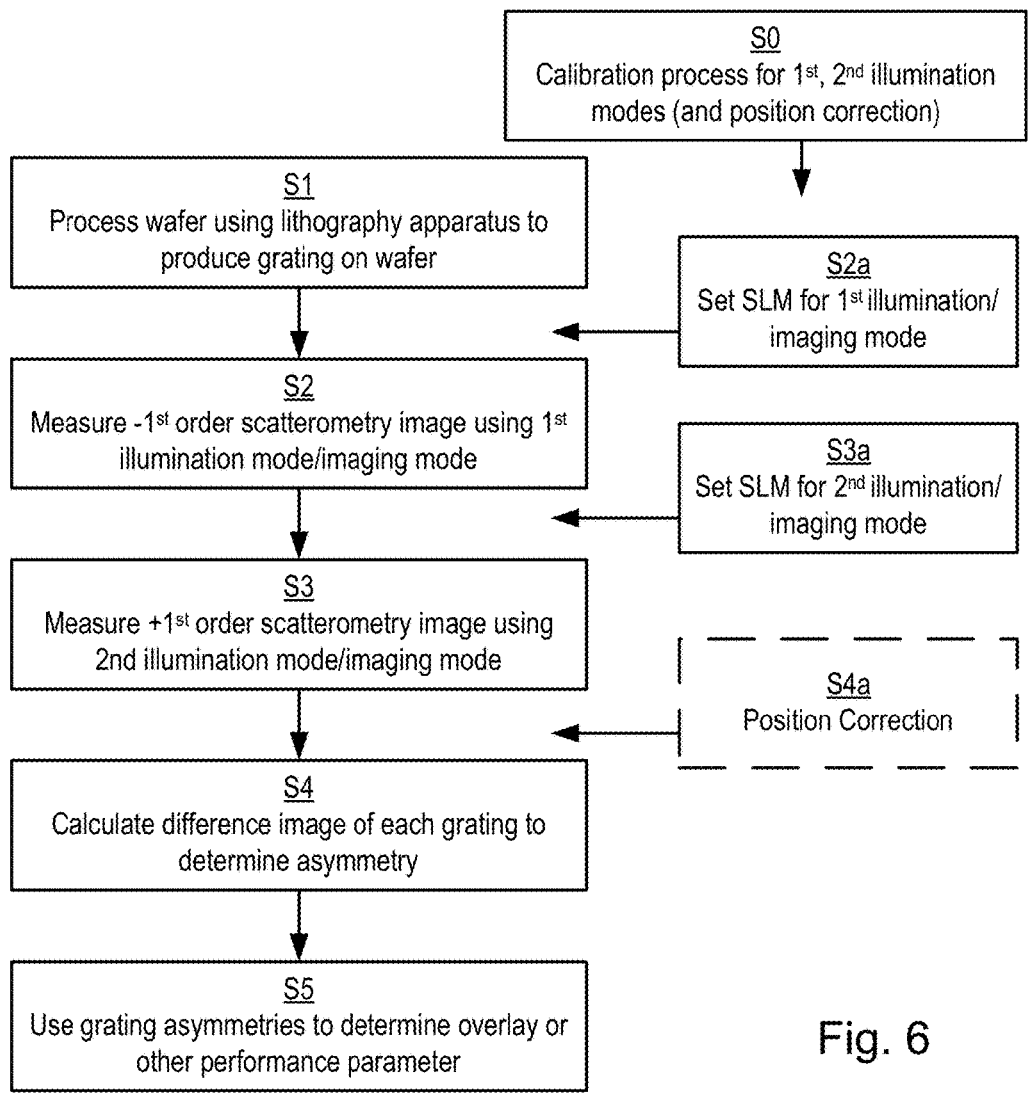

FIG. 6 is a flowchart showing the steps of an overlay measurement method using the scatterometer of FIGS. 3a-3d, including calibration and correction steps performed in accordance with a first embodiment of the invention.

Figure 7:
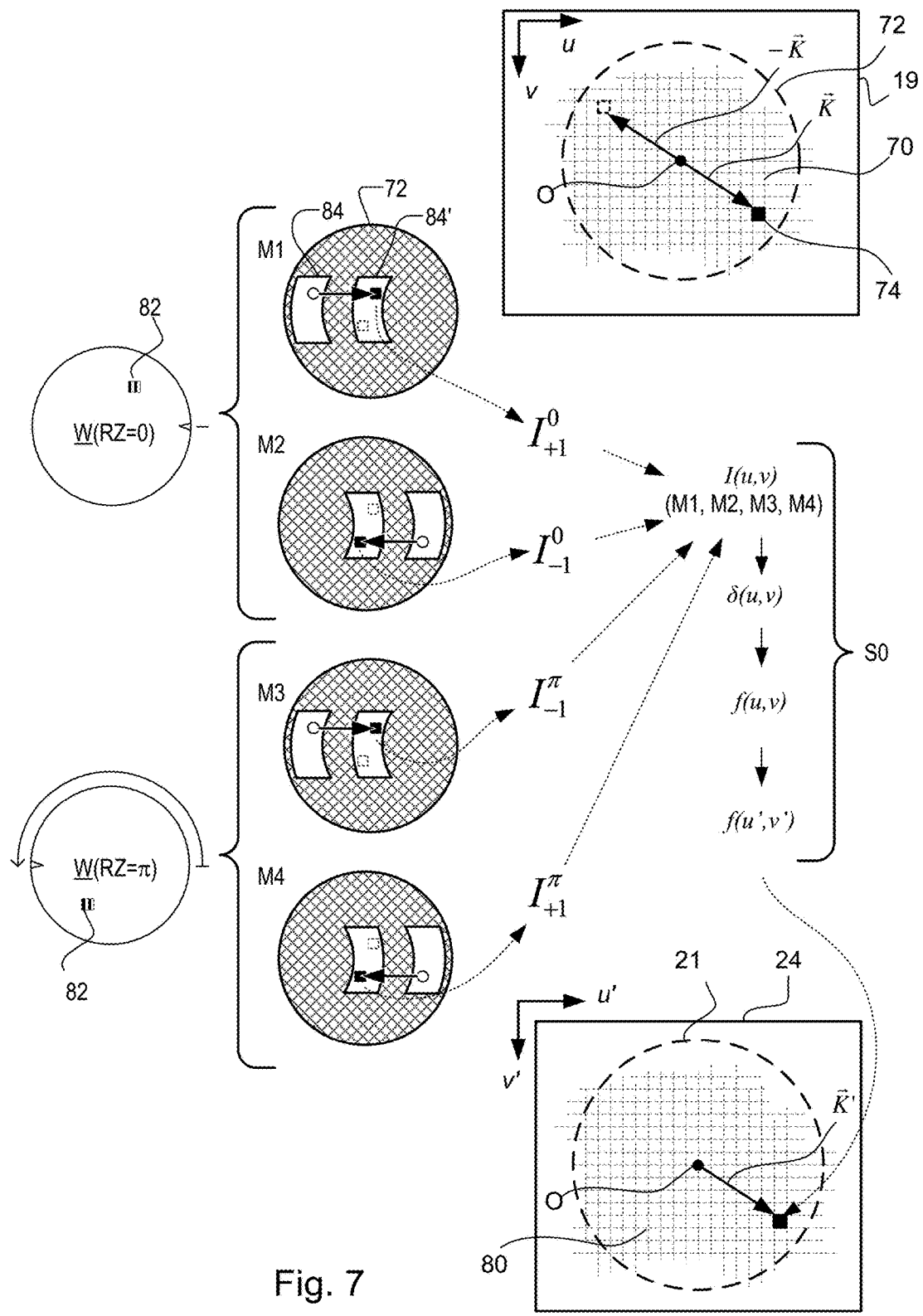

FIG. 7 illustrates the principles of the calibration and correction steps in the method of FIG. 6.

FIGS. 8a-8d comprises 8a a schematic diagram of an inspection apparatus according to a second embodiment of the invention, 8b a detail of diffraction spectrum of a target grating for on-axis illumination 8c a second pair of field stop patterns usable in the scatterometer to provide further imaging modes in using the scatterometer for diffraction based overlay measurements and 8d a third pair of field stop patterns combining the first and second pair of apertures.

FIG. 9 illustrates a set of calibration measurements made in the method of FIG. 6 as applied in the inspection apparatus of the second embodiment.

Figure 10:
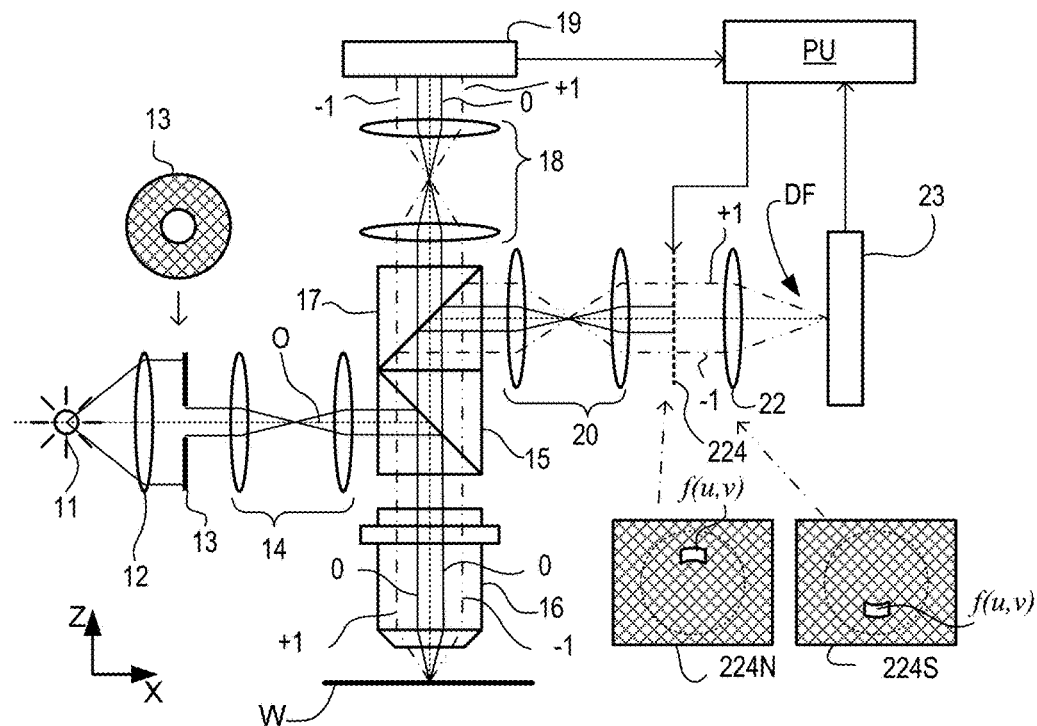

FIG. 10 illustrates a third embodiment of the invention in which a single spatial light modulator serves both for correction of radiation intensities and selection of different imaging modes.

Figure 11A:
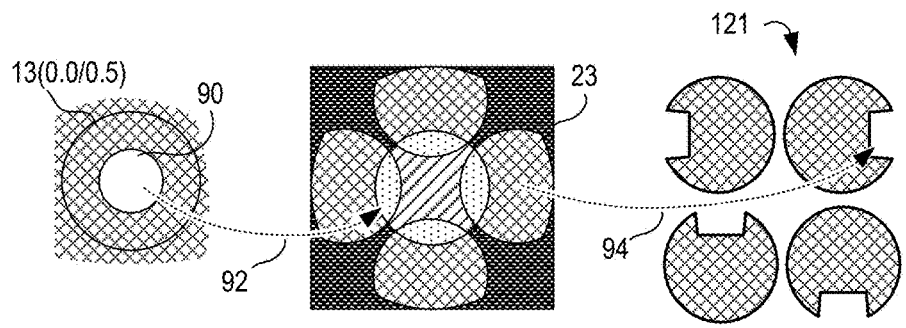
Figure 11B:
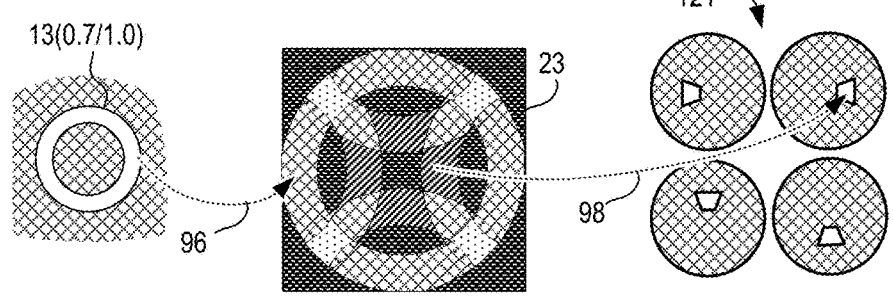

FIGS. 11a and 11b illustrate the configuration of different field stop patterns in the second and third embodiments, when an illumination mode changes from on-axis to off-axis.

Figure 12:
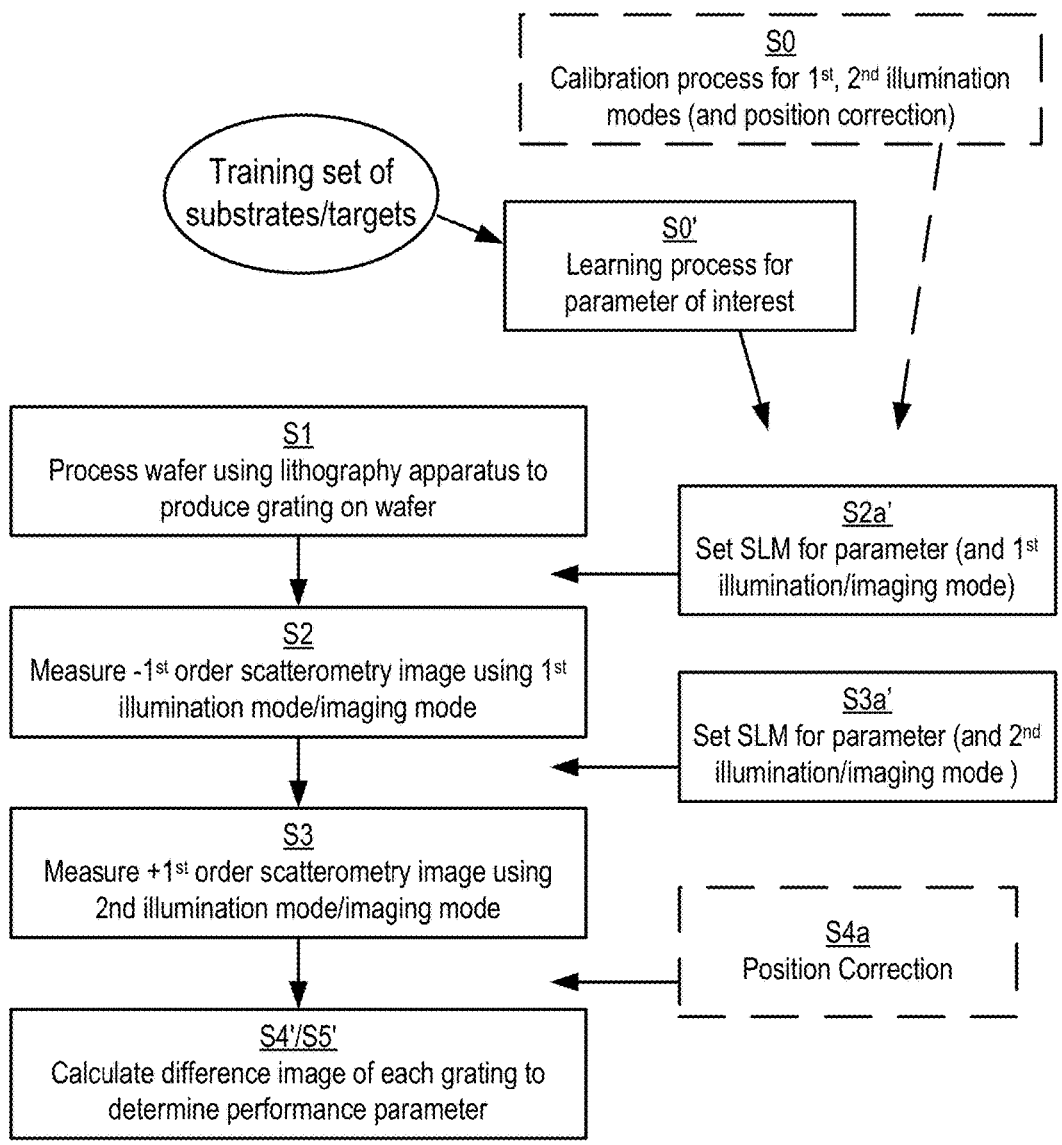

FIG. 12 is a flowchart showing the steps of a measurement method in accordance with a fourth embodiment of the invention which includes calibration by learning to measure directly a parameter of interest.

Figure 13A:
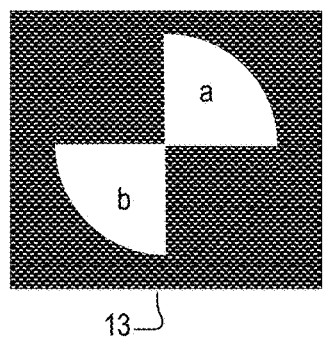
Figure 13B:
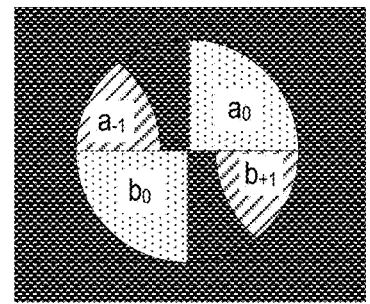

FIGS. 13a and 13b illustrate 13a a segmented illumination aperture and 13b a corresponding diffraction spectrum for use in various embodiments of the invention.

Figure 14:
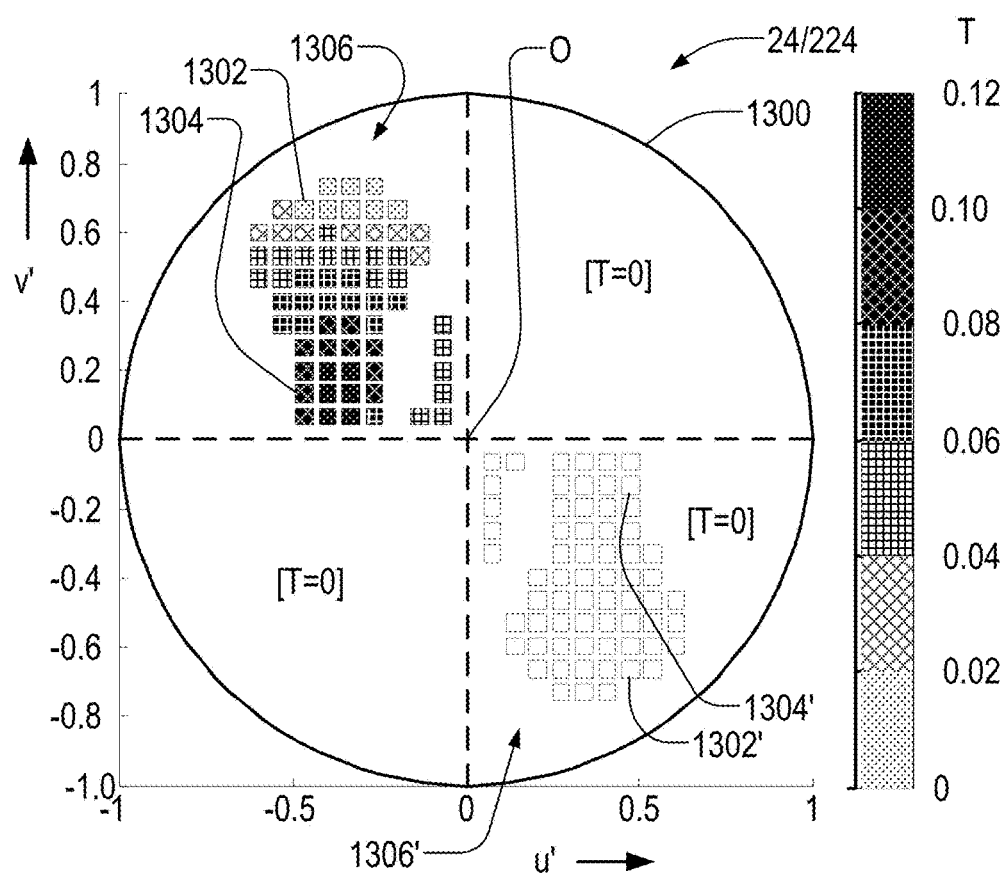
Figure 15:
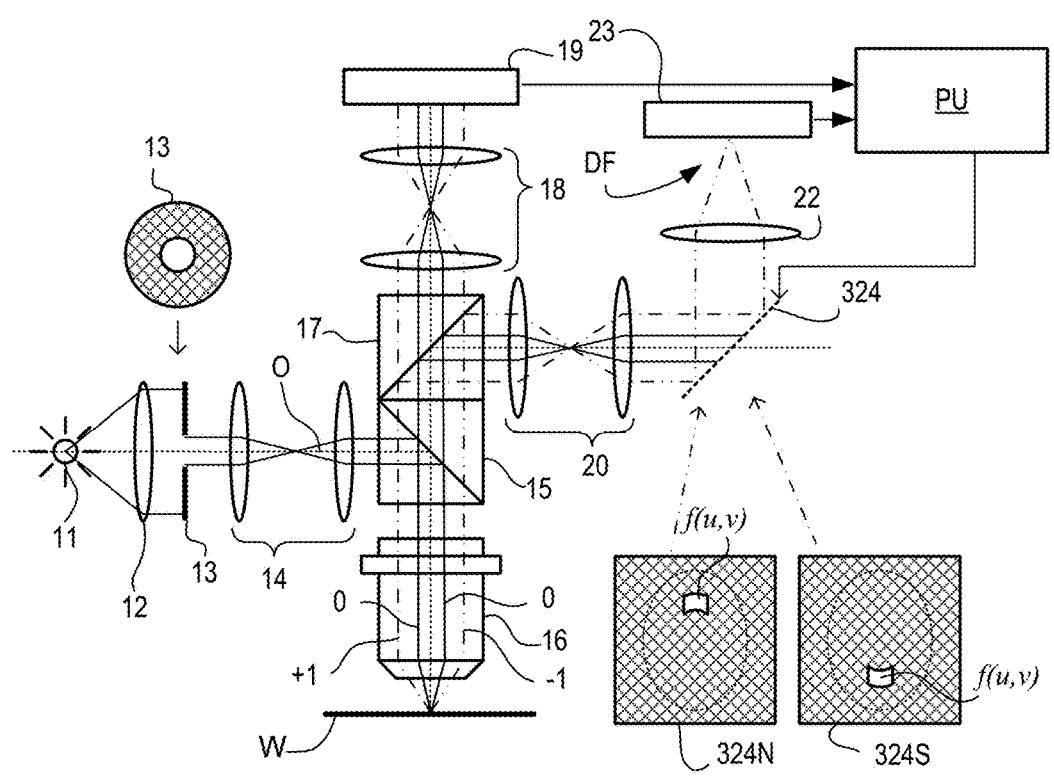

FIG. 14 illustrates an example a learned attenuation pattern applied by the SLM in the method of FIG. 12 with the illumination mode of FIGS. 13a-13b for the measurement of focus FIG. 15 illustrates a modified embodiment of the invention in which a reflective spatial light modulator is used in place of the transmissive spatial light modulator used in the third embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing embodiments of the invention in detail, it is instructive to present an example environment in which embodiments of the present invention may be implemented.

Figure 1:
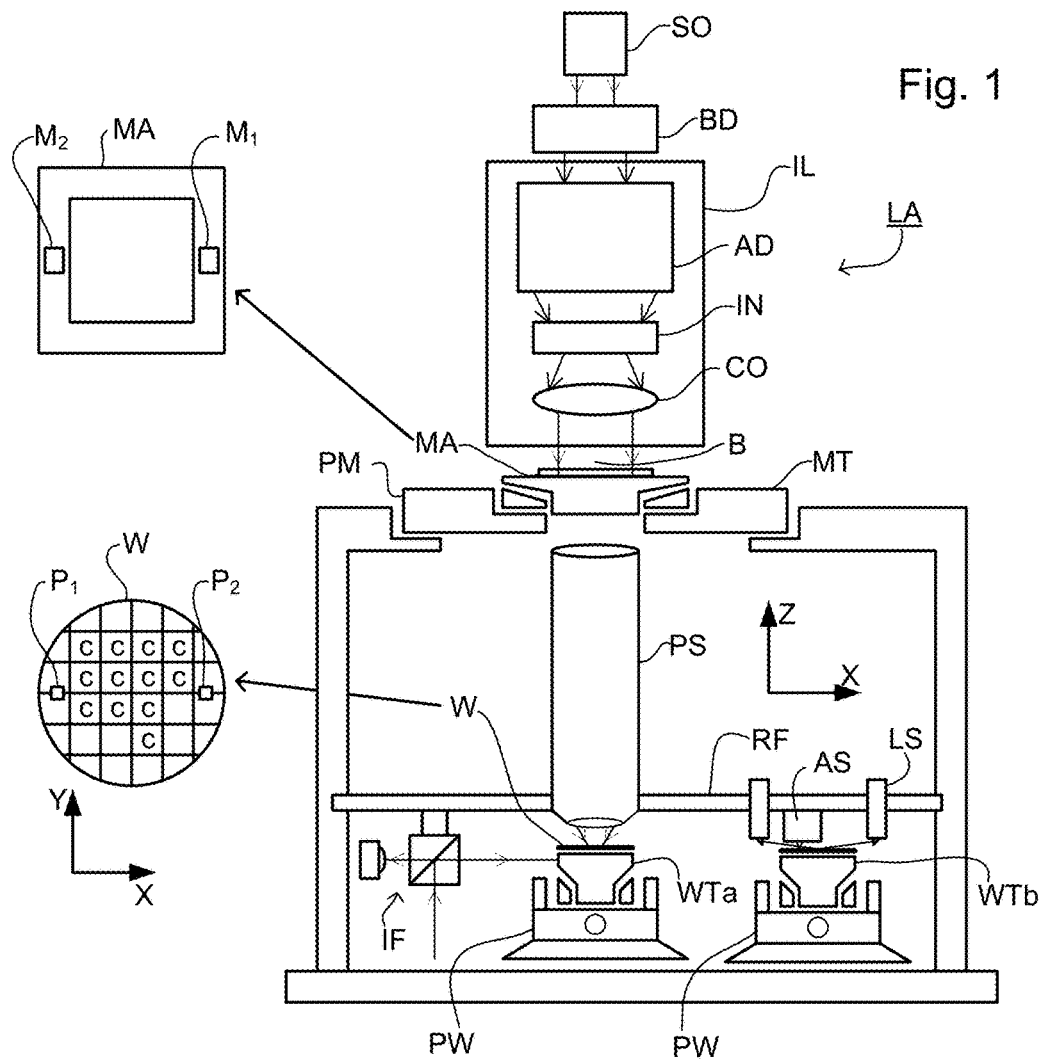
FIG. 1 depicts a lithographic apparatus according to an embodiment of the invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:

1. In step mode, the patterning device support (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WT are scanned synchronously while a pattern imparted to the radiation beam is projected onto a target portion C (i.e., a single dynamic exposure). The velocity and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

Figure 2:
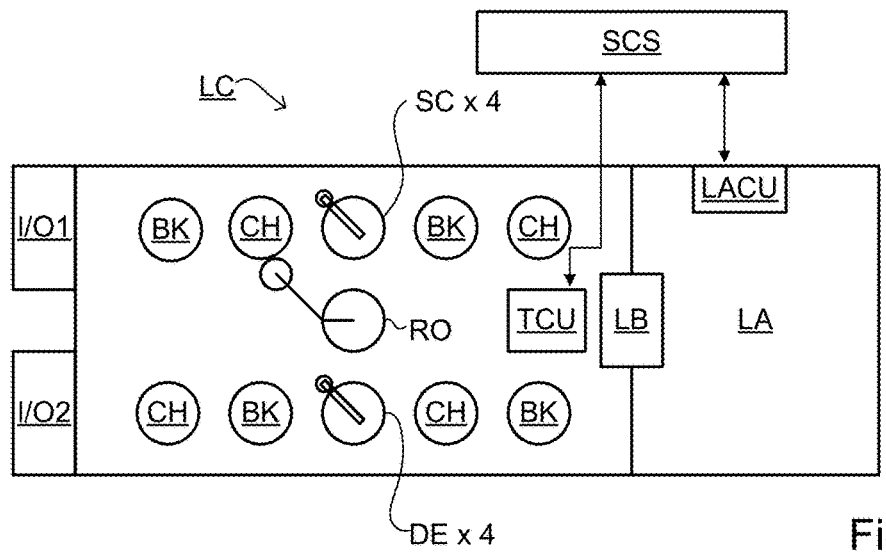
FIG. 2 depicts a lithographic cell or cluster according to an embodiment of the invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Small Target Dark Field Metrology

The targets used by conventional scatterometers are relatively large, e.g., 40 μm by 40 μm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 μm by 10 μm or less, e.g., so they can be positioned in amongst product features, rather than in the scribe lane, so-called "small target" metrology has been proposed, in which the grating is made smaller than the measurement spot (i.e., the grating is overfilled). Typically small targets are measured using dark field scatterometry in which the zeroth order of diffraction (corresponding to a specular reflection) is blocked, and only higher orders processed. Examples of dark field metrology can be found in international patent applications WO 2009/078708 and WO 2009/106279, which documents are hereby incorporated by reference in their entirety. Diffraction-based overlay using dark-field detection of the diffraction orders enables overlay measurements on smaller targets. These targets can be smaller than the illumination spot and may be surrounded by product structures on a wafer. The intensities from the environment product structures can efficiently be separated from the intensities from the overlay target with the dark-field detection in the image-plane.

Figure 3B:
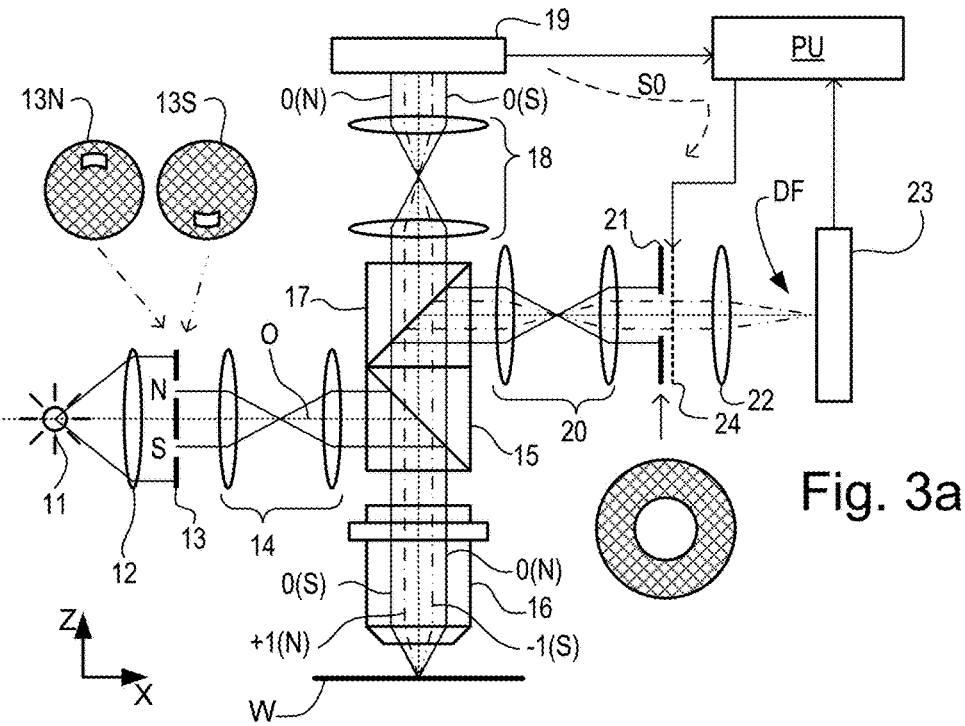
Figure 3B:
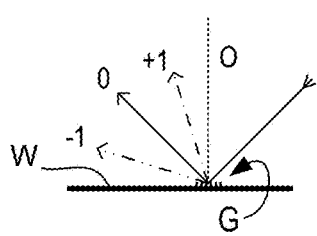

A dark field metrology apparatus according to a first embodiment of the invention is shown in FIG. 3a. A target grating G and diffracted rays are illustrated in more detail in FIG. 3b. The dark field metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark, as any unnecessary light outside the desired illumination mode will interfere with the desired measurement signals.

As shown in FIG. 3b, target grating G is placed with substrate W normal to the optical axis O of objective lens 16. A ray of illumination I impinging on grating G from an angle off the axis O gives rise to a zeroth order ray (solid line O) and two first order rays (single dot-dash line +1 and double dot-dash line −1). It should be remembered that each of the rays illustrated is just one of many parallel rays covering the area of the substrate which including metrology target grating G and possibly, with an overfilled small target grating, other features unrelated to the measurement process. Since the aperture in plate 13 has a finite width (necessary to admit a useful quantity of light) the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches and illumination angles can be designed or adjusted so that the first order rays entering the objective lens are closely aligned with the central optical axis. The rays illustrated in FIGS. 3a and 3b are shown somewhat off axis, purely to enable them to be more easily distinguished in the diagram.

At least the 0 and +1 orders diffracted by the target on substrate W are collected by objective lens 16 and directed back through beam splitter 15. Returning to FIG. 3a, both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction, which are not the subject of the present disclosure. In accordance with the invention, however, the pupil plane image sensor 19 play a part in calibrating a correction to be applied by a spatial light modulator in the second measurement branch.

In the second measurement branch, an optical system including lenses 20, 22 forms an image of the target on the substrate W on sensor 23 (e.g. a CCD or CMOS sensor). In the second measurement branch, an aperture plate referred to as field stop 21 is provided in a plane that is conjugate to the pupil-plane. This plane will be referred to as an 'intermediate pupil plane' when describing the invention. Field stop 21 functions to block the zeroth order diffracted beam so that the image of the target formed on sensor 23 is formed only from the −1 or +1 first order beam. The images captured by sensors 19 and 23 are output to image processor and controller PU, the function of which will depend on the particular type of measurements being performed. Note that the term 'image' is used here in a broad sense. An image of the grating lines as such will not be formed, if only one of the −1 and +1 orders is present.

In accordance with a first embodiment of the invention, the apparatus of FIG. 3a includes a spatial light modulator (SLM) 24, which is used to apply corrections to the imaging beam in an intermediate pupil plane of the imaging branch of the optical system. SLM 24 in this embodiment is controlled by controller PU in accordance with calibration results obtained from a calibration step S0, to be described in more detail below. The calibration step uses the pupil imaging sensor 19, and may be shared with calibration measurements for use in metrology methods which use primarily the pupil image sensor 19.

SLM 24 is illustrated as lying in a plane adjacent to that field stop 21. In later embodiments, it will be seen how the functions of the field stop and SLM can be combined. For the time being, they can be regarded as separate. As the skilled reader will know, a spatial light modulator or SLM is a device which can be controlled electronically to modulate the passage of radiation through it, according to a desired pattern of transmission characteristics, across the plane of the SLM device. Typically, SLM devices are organized as arrays of pixels, similar to pixels of a display device. While, in a display device, the value assigned to a pixel dictates the brightness of a pixel as perceived by a viewer, in the case of SLM 24, the value assigned to a pixel will determine the attenuation of radiation passing through that pixel. Since the pixels of the SLM 24 are located in an intermediate pupil plane, rather than image plane such as the plane of sensor 23, the attenuation applied at a given location in the plane of SLM 24 will attenuate a certain spatial frequency component which contributes to the image measured by sensor 23. Different types of SLM including both transmissive and reflective types can be employed in the invention. Some of these will be mentioned further below.

The particular forms of aperture plate 13 and field stop 21 shown in FIGS. 3a-3d are purely examples. In other embodiments of the invention, some of which will be illustrated and described below, on-axis illumination of the targets is used and a field stop with an off-axis aperture is used to pass substantially only one first order of diffracted light to the sensor. In yet other embodiments, 2nd, 3rd and higher order beams (not shown in FIGS. 3a-3d) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Alternatively or in addition, a set of plates 13 could be provided and swapped, to achieve the same effect. A programmable illumination device such as a deformable mirror array or transmissive spatial light modulator can be used also. Moving mirrors or prisms can be used as another way to adjust the illumination mode.

As just explained in relation to aperture plate 13, the selection of diffraction orders for imaging can alternatively be achieved by altering the field stop 21, or by substituting a field stop having a different pattern, or by replacing the fixed field stop with a programmable spatial light modulator. In that case the illumination side of the measurement optical system can remain constant, while it is the imaging side that has first and second modes. In the present disclosure, therefore, there are effectively two types of embodiment: one where the illumination mode is changed and another where the imaging mode is changed. In each case the desired effect is the same, namely to select first and second portions of the non-zero order diffracted radiation which are symmetrically opposite one another in the diffraction spectrum of the target. The first embodiment of the invention, illustrated in FIGS. 3a-3d and described above, is of the first type, in which illumination modes are changed. The second, third and fourth embodiments, described below, are of the second type, where the imaging mode is changed between the first and second measurements. In principle, the desired selection of orders could be obtained by a combination of changing the illumination modes and the imaging modes simultaneously between measurements, but that is likely to bring disadvantages for no advantage, so it will not be discussed further. Most embodiments therefore will involve changing either the illumination mode or the imaging mode between the first and second measurements, while the other mode remains constant.

Figure 3C:
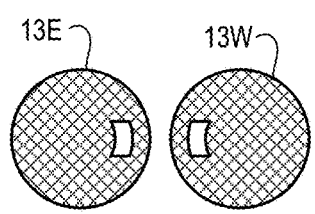
Figure 3D:
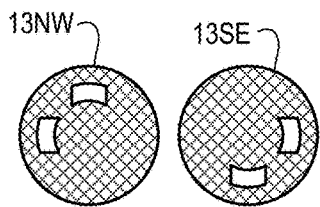

While the optical system used for imaging in the present examples has a wide entrance pupil which is restricted by the field stop 21, in other embodiments or applications the entrance pupil size of the imaging system itself may be small enough to restrict to the desired order, and thus serve also as the field stop. Different aperture plates are shown in FIGS. 3c and 3d which can be used as described further below. For the time being, it is sufficient to consider simply that the aperture plate 13N is used.

FIG. 4 depicts a composite target formed on a substrate according to known practice. The composite target comprises four gratings 32 to 35 positioned closely together so that they will all be within a measurement spot 31 formed by the illumination beam of the metrology apparatus and thus are all simultaneously illuminated and simultaneously imaged on sensors 19 and 23. In an example dedicated to overlay measurement, gratings 32 to 35 are themselves composite gratings formed by overlying gratings that are patterned in different layers of the semi-conductor device formed on substrate W. Gratings 32 to 35 are differently biased in order to facilitate measurement of overlay between the layers in which the different parts of the composite gratings are formed. In one example, gratings 32 to 35 have biases of +d, −d, +3d, −3d respectively. This means that one of the gratings has its components arranged so that if they were both printed exactly at their nominal locations one of the components would be offset relative to the other by a distance d. A second grating has its components arranged so that if perfectly printed there would be an offset of d but in the opposite direction to the first grating and so on. While four gratings are illustrated, a practical embodiment might require a larger matrix to obtain the desired accuracy. For example, a 3×3 array of nine composite gratings may have biases −4d, −3d, −2d, −d, 0, +d, +2d, +3d, +4d. Separate images of these gratings can be identified in the image captured by sensor 23.

FIG. 5 shows an example of an image that may be formed on and detected by the sensor 23, using the target of FIG. 4 in the apparatus of FIGS. 3a-3d, using the aperture plates 13N or 13S from FIG. 3a. While the pupil plane image sensor 19 cannot resolve the different individual gratings 32 to 35, the image sensor 23 can do so. The dark rectangle labeled 23 represents the field of the image on the sensor 23, within which the illuminated spot 31 on the substrate is imaged into a corresponding circular area 41. Within this, rectangular areas 42-45 represent the images of the small target gratings 32 to 35. If the gratings are located in product areas, product features may also be visible in this image. Image processor and controller PU processes these images to identify the separate images 42 to 45 of gratings 32 to 35. This can be done by pattern matching techniques, so that the images do not have to be aligned very precisely at a specific location within the sensor frame. Reducing the need for accurate alignment in this way greatly improves throughput of the measuring apparatus as a whole. However, positional variation may introduce inaccuracies in the measurement results, if the imaging process is subject to non-uniformities across the image field. In accordance with another invention, subject of a application U.S. 61/412,381 corrections are made in the measured intensities, according to the position at which each grating image is observed within the field of image sensor 23.

Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance, which can be measured by measuring asymmetry of a grating target, is an important example of such a parameter.

FIG. 6 illustrates how, using the apparatus of FIGS. 3a-3d, overlay error between the two layers containing the component gratings 32 to 35 is measured through asymmetry of the gratings, as revealed by comparing their intensities in the +1 order and −1 order dark field images. At step S1, the substrate, for example a semiconductor wafer, is processed through the lithographic cell of FIG. 2 one or more times, to create a structure including the overlay targets 32-35. At S2, using the metrology apparatus of FIGS. 3a-3d with only a single pole of illumination (e.g. north, using plate 13N), an image of the gratings 32 to 35 is obtained using only one of the first order diffracted beams (say +1). Then, by changing the aperture plate 13 to the opposite illumination mode (e.g. south, using plate 13S) a second image of the gratings is obtained using the other first order diffracted beam can be obtained (step S3). Consequently the −1 diffracted radiation is captured in the second image.

The images obtained in steps S2, S3 look generally like that shown in FIG. 5, where the area of the illumination spot 31 is imaged using just the −1 or the +1 order diffracted radiation into circle 41(−) and the individual grating images are labeled 42(−) to 45(−). Note that, by including only half of the first order diffracted radiation in each image, the 'images' referred to here are not conventional dark field microscopy images. The individual grating lines will not be resolved. Each grating will be represented simply by an area of a certain grey level. The asymmetry of the grating structure, and hence overlay error, can then be determined by the image processor and controller PU in a step S4. In this step, the intensity values obtained in the images for the +1 and −1 orders for each grating 32-35 are compared to identify any difference in their intensity. In step S5, from knowledge of the overlay biases of the gratings, the results of these comparisons are used to determine the amount of overlay error affecting the substrate W in the vicinity of the target G.

Typically, a target grating will be aligned with its grating lines running either north-south or east-west. That is to say, a grating will be aligned in the X direction or the Y direction of the substrate W. Note that aperture plate 13N or 13S can only be used to measure gratings oriented in one direction (X or Y depending on the set-up). For measurement of an orthogonal grating, rotation through 90° and 270° might be implemented. More conveniently, however, illumination from 'east' or 'west' is provided in the illumination optics, using the aperture plate 13E or 13W, shown in FIG. 3c. The aperture plates 13N to 13W can be separately formed and interchanged, they may be formed as patterns at different positions on a larger plate, to that a selected pattern to be slid or rotated into place, or they may be a single aperture plate which can be rotated by 90, 180 or 270 degrees. As mentioned already, the off-axis apertures illustrated in FIG. 3c could be provided in field stop 21 instead of in illumination aperture plate 13. In that case, the illumination would be on axis.

FIG. 3d shows a third pair of aperture plates that can be used to combine the illumination modes of the first and second pairs. Aperture plate 13NW has apertures at north and east, while aperture plate 13SE has apertures at south and west. One of these gratings will diffract light from the east and west portions of the aperture plates, while the other grating will diffract light from the north and south portions. Provided that cross-talk between these different diffraction signals is not too great, measurements of both X and Y gratings can be performed without changing the illumination mode.

Where a number of targets are to be measured across the substrate, there are various possibilities for sequencing the measurement to achieve the maximum throughput and accuracy with a given hardware set-up. For example, measurement steps S2 and S3 can be performed each target, swapping the illumination mode, before moving to the next target. To minimize the swapping operations, the steps may be performed in the order S2, S3 for one target, and in the order S3, S2 for the next. Alternatively, the step S2 may be performed for all targets on the substrate, or for a certain group of targets, before swapping the illumination mode and performing step S3 for all the targets. The images can be stored in controller PU, or external storage. Provided they are indexed or labeled with their corresponding target ID and illumination mode, the order in which they are obtained is unimportant for their subsequent processing.

Tool Asymmetry and Asymmetry Correction Using SLM

Because, in the example process just described, the illumination mode changes to rotate the angle of incidence by 180°, differences in intensity between the images made using −1 and +1 order should be attributable entirely to asymmetry, and hence overlay error, in the target gratings. However, while the optical system in principle remains constant, in practice the difference in optical paths through the optical elements, especially the objective lens 16, introduces intensity differences that are dependent on the measuring apparatus. These differences, which are due to the use of a real scatterometer as the measuring tool, rather than some theoretical ideal or 'perfect' scatterometer. These differences make the overlay or other measurement result subject to tool-induced errors. To eliminate these errors, it would be an option to keep the measurement optical system absolutely unchanged between the measurement steps S2 and S3, and to rotate the substrate 180°. Unfortunately, the rotation step between measurements would introduce delays which can reduce the throughput of the process. (It may also increase the risk that measurement conditions between the two images will be non-identical due to drift in some component.)

The inventors have therefore considered what measures might be taken to correct some or all of these tool-dependent errors, caused by a difference in characteristics of the optical path when changing imaging modes and/or illumination modes, so as to obtain accurate measurements of overlay, asymmetry etc. without the burden of rotating the substrate.

Referring again to FIG. 6 a calibration and correction process represented by steps S0, S2a, S3a and S4a is shown alongside the measurement process of steps S1 to S5 described already. Summarizing the calibration and correction method briefly, the calibration process in step S0 is performed using the branch of the scatterometer which includes the pupil image sensor 19, rather than the branch that includes the image sensor 23 in which the small target dark field asymmetry measurements are actually to be made. Calibration measurements are made on a large (e.g. 40×40 μm$^2$) grating, using the same illumination apertures 13 that will be used for the dark field image intensity measurements in steps S2, S3. Also the grating pitch, wavelength and polarization should be the same to the ones that will apply in the steps S2, S3. The grating used need not have two layers or any particular overlay. Examples of calibration step S0 will be illustrated and described in more detail below, with reference to FIGS. 7 and 9.

During the actual measurement of targets, in step S2a, SLM 24 is programmed with a correction pattern that has been determined through the calibration process, and is appropriate for the −1 order image measurement, performed in step S2. Similarly, in step S3a, SLM 24 is set up with a correction pattern appropriate to the second illumination mode, prior to measurement of the +1 order scatterometry image in step S3. These correction patterns can be regarded as an "asymmetry map" of the inspection apparatus.

Step S4a represents a correction for differences in optical path caused by variation of the position of a small target within a field of view of the scatterometer. For this positional correction, a calibration step S0 includes performing a plurality of calibration measurements on a target which is placed at different positions within the field of view 31 between different calibration measurements. Correction step S4a is performed by software within controller PU. This position correction is described in our application no. U.S. 61/412,381. The position correction will not be described in further detail here and calibration step S0 will always refer to obtaining a pupil-based asymmetry map for the two illumination modes or imaging modes as applied in steps S2 and S3 and described further below.

FIG. 7 illustrates the principle of the calibration measurements, by which pixel intensity measurements made by pupil plane image sensor 19, represented by the rectangle at the top of the drawing, are used to derive correction factors to be applied at pixel locations in SLM 24, represented by the rectangle at the foot of the page, and located in an intermediate pupil plane of the substrate image sensor 23. Pupil image sensor 19 is organized as a rectangular array 70 of pixels, indexed by a pair of co-ordinates u, v, as marked. The directions of the u and v co-ordinates correspond to the X and Y axes of the apparatus, but because sensor 19 is in a conjugate pupil plane of the objective lens 16, positions in u and v correspond to spatial frequencies in the diffraction spectrum of the target, rather than points in the substrate plane. A dashed circle 72 represents the angular extent of the pupil of objective lens 16 as it is transmitted through the intermediate pupil aperture stop towards the image as detected on 23. The intermediate aperture stop can at maximum be as large as the intersection of the 13N and 13S apertures after diffraction, where they coincide partly at the center of the pupil plane. The location of the optical axis O is indicated by a spot. A vector $\vec{K}$, indicates the position of a particular pixel 74 in the array 70. This pixel is shaded black. Symmetrically opposite to pixel 74 is another pixel labeled 76 and shaded white, whose vector position from the origin O on the optical axis is $-\vec{K}$. For a diffraction spectrum which is symmetrical about the optical axis O, these pixels record symmetrically opposite parts of the spectrum.

As illustrated schematically at the right hand side of the diagram, in step S0 calibration measurements are taken of the intensity I(u,v) at each pixel with a well defined target positioned in the field of view of the scatterometer, firstly with a zero angle of rotation in the substrate plane and secondly with a 180 degrees (π) rotation. RZ in the drawing labels refers to rotation about the Z axis. By comparing the intensities between the two rotations of the target, and between the symmetrically opposite pixel positions in the pupil plane pixel array 70, an asymmetry of the optical system can be calculated, to obtain an asymmetry value δ, which is relative to an average intensity of the two pixels. It should be noted that it is sufficient to take either the +1 order intensity at wafer rotation 0 and 180 degrees, or the −1 order intensity at wafer rotation 0 and 180 degrees. In the example embodiment, both sets comprising each of two intensities, thus four intensities in total, are used for more robust calibration.

This map of asymmetries across the pixel array of the pupil image sensor is transformed into an array of correction factors f corresponding to the pixel positions u, v. This in turn is converted, if necessary, to a map of the correction factor f at pixel positions u', v' in a pixel array 80 of SLM 24. The co-ordinate pairs u', v' may in principle be identical to the co-ordinates u, v, but allowance should be made for a difference in the number of pixels (sampling density) and for a possible rotation between the two pupil planes in the SLM 24, compared to sensor 19. The correction factors f can be stored in a two-dimensional array, indexed directly by the co-ordinates u', v'. They may be indexed by vector K or in any other desired format. Since SLM 24 can only attenuate radiation, not amplify it, the correction values must be scaled down before being applied to SLM 24, so that there is headroom to apply correction factors both greater than and less than some value that represents unity.

To provide some theoretical basis and notation for a more detailed description of the calibration and correction processes, let us start with expressions for the as-detected intensities $I_{\pm 1}$ of each pixel in the +1 and −1 orders; the expression applies for a given pixel-pair in the pupil plane image detected by sensor 19, with one pixel belonging to the +1 and the other to the −1 order; in the pupil plane, both pixels are related via a point-inversion through the origin O. The transmission characteristics of the scatterometer for the two paths through the objective lens 16 for the opposite pixels of the pixel-pair are denoted by T (1±δ). Further, let $I_{\pm 1}$ be the ideal intensity of the respective first orders, corrected for the asymmetry in transmission. The common transmission factor T is symmetrical in effect, and so not of particular interest for the present description. It can be put equal to 1.

Returning to FIG. 7, the left hand part of the diagram illustrates the performance of four calibration measurements on a target grating 82. Substrate W in this calibration process may be a product wafer, or a special calibration substrate. As mentioned already, calibration target grating 82 is a larger grating than the overlay measurement gratings 32 etc. shown in FIG. 4, and is larger than the illumination spot 31 of the inspection apparatus. Four measurement steps M1 to M4 are illustrated, each performed under different conditions and feeding a respective intensity value into the calibration calculation. Two measurements M1, M2 are performed with substrate W at a first angle of rotation, conveniently referred to as zero degrees. A further pair of measurements M3, M4 are made with the substrate, and hence grating 82, rotated by 180° (π). In each pair of measurements, one measurement is taken with each of the illumination modes to be used in the overlay measurements. In the case of the apparatus shown in FIG. 3a, the illustration corresponds to making measurements with the aperture plates 13E and 13W, for example. Referring to the diagram for measurement M1, the circle represents the pupil image 72, recorded in pupil image sensor 19. The zero order image of the aperture in aperture plate 13 is indicated at 84. Because of the diffraction caused by the grating having a pre-determined pitch, the first order diffraction signal appears as a copy of the aperture displaced by a certain amount in the pupil image, as shown at 84'. The intensity of one pixel within this area 84' comprises the intensity of the +1 diffraction order corresponding to illumination originating from a position indicated by a small circle in the aperture 84. The same pattern appears in the intermediate pupil plane of the imaging branch. Zero order diffracted radiation occurring at the position 84 is blocked during measurements, by field stop 21. The intensities of the black, integrated over the area of the diffracted aperture 84; provide the measured intensity $I_{+1}{}^0$.

Changing the aperture, for example from 13E to 13W, the measurement step M2 is performed to measure the intensity of the −1 order at zero rotation, namely $I_{-1}{}^0$. As will be seen, each pixel in each measurement has a symmetrically placed pixel on the other side of the optical axis, indicated in these diagrams by a small dotted square.

After the measurements M1, M2 have been taken, the substrate W is rotated and the grating 82 is again brought into the field of view of the inspection apparatus. Measurements M3 and M4 are performed exactly in the same way as M1 and M2 respectively. However, because the grating has been rotated 180°, measurement M3 obtains the −1 order intensities, while measurement obtains the +1 order intensities. It is an arbitrary choice which of two first orders is labeled +1 and which is labeled −1. The point is that, by rotating the grating 180°, the opposite order is brought to the same pixel positions in the pupil image 72. By combining the results of measurements M1 to M4, therefore, asymmetry due to the instrument itself, in particular asymmetries due to the different optical paths used in the different illumination modes between measurements, can be calculated and corrected using the correction factors f.

In the calibration process, measurements M1 and M2 respectively $$I_{+1}{}^0 = (1+\delta)\tilde{I}_{+1}$$

$$I_{+1}{}^0 = (1+\delta)\tilde{I}_{-1}$$

Measurements M3, M4 at a wafer (substrate) rotation π, the optical paths for the +1 and −1 orders are interchanged, to measure:

$$I_{+1}{}^\pi = (1+\delta)\tilde{I}_{+1}$$

$$I_{-1}{}^\pi = (1+\delta)\tilde{I}_{-1}$$

As already mentioned, these intensities are measured separately for every pixel of sensor 19. From these measured intensities, sensor asymmetry δ per pixel can be computed using all four intensities simultaneously for the equation:

$$\delta = 0.50\left(\frac{I_{+1}^0 - I_{+1}^\pi}{I_{+1}^0 + I_{+1}^\pi} + \frac{I_{-1}^0 - I_{-1}^\pi}{I_{-1}^0 + I_{-1}^\pi}\right)$$

With this procedure we can calibrate the tool asymmetry δ for every pixel-pair in the first orders once and for all, and this is achieved with only one 180° rotation of the substrate over π). Subsequently, we can use SLM 24 to correct the intensities measured for small target gratings to obtain overlay values without substrate rotation. The correction factors $f_{+1}$ and $f_{-1}$ are obtained (per pixel in the pupil-plane) by applying the equation to a measurement performed at the 0 wafer (substrate) rotation:

$$\tilde{I}_{\pm 1} = f_{\pm 1} I_\pm^0$$

therefore $$f_{\pm 1} = \frac{1}{1 \pm \delta}$$

As already explained, the asymmetries are obtained in step S4 based on the intensities averaged out over the dark-field image 42 etc. of the small grating 32 etc., measured in steps S2 and S3. Because of Parceval's theorem, the asymmetries can also be modeled by averaging out the intensities in the intermediate pupil plane over the aperture. Consider a target such as the composite target of FIG. 4, in which four gratings 32 to 35 are included. There may be a pair of X-direction gratings and a pair of Y-direction gratings, with overlay biases +d and −d in each pair of gratings. Using the notation introduced in FIG. 7 and recalling that $\delta(\vec{K})$ represents the tool-induced asymmetry between illumination modes at a given pixel location $\vec{K}$, the asymmetries found for the +d and −d biased gratings at each pixel pair in step S4 for 0-degree substrate rotation are:

$$A_0^{\pm d} = \int_{NA=0.40} [\tilde{I}_{+1}^{\pm d}(\vec{K}) - \tilde{I}_{-1}^{\pm d}(\vec{K})]d\vec{K} + \int_{NA=0.40} \delta(\vec{K})[\tilde{I}_{+1}^{\pm d}(\vec{K}) + \tilde{I}_{-1}^{\pm d}(\vec{K})]d\vec{K}$$

while for substrate rotation π, the asymmetries found for the +d and −d biased gratings become:

$$A_\pi^{\pm d} = \int_{NA=0.40} [\tilde{I}_{+1}^{\pm d}(\vec{K}) - \tilde{I}_{-1}^{\pm d}(\vec{K})]d\vec{K} - \int_{NA=0.40} \delta(\vec{K})[\tilde{I}_{+1}^{\pm d}(\vec{K}) + \tilde{I}_{-1}^{\pm d}(\vec{K})]d\vec{K}$$

The first term on the right-hand side of each of the above two equations is the desired difference/asymmetry signal. The second term on the right-hand side of each equations is the unwanted disturbance due to the tool asymmetry modeled by $\delta(\vec{K})$. Note that the tool asymmetry per-pixel couples to the sum of the +1 and −1 diffraction orders, and the terms are averaged over the aperture in field stop 21. Due to this coupling, the effect of the tool-induced asymmetry depends on the process conditions, for example the thickness of a layer in between the top and bottom gratings of the overlay grating. In other words, different process conditions could lead to different offsets in the derived asymmetries. The tool-induced offset in the 1$^{st}$-order asymmetry between the two substrate rotations at 0 and 180 degrees can be denoted by $\Delta A^{\pm d}$:

$$\Delta A^{\pm d} = \int_{NA=0.40} [I_{+1}^{\pm d}(\vec{K}) + I_{-1}^{\pm d}(\vec{K})]\delta(\vec{K})d\vec{K}$$

Because of the averaging over the aperture, the tool asymmetry cannot be corrected by a one-time calibration of measured target asymmetry values. However, by taking the sum of the equations for $A_0^{\pm d}$ and $A_\pi^{\pm d}$ above, effectively averaging over 0 and π wafer rotations, the terms due to the tool asymmetry $\delta(\vec{K})$ are perfectly cancelled out, allowing correction in the pupil plane using calibration step S0 and SLM 24.

Second Embodiment

FIGS. 8a-8d illustrates a second embodiment of the invention, which is of the alternative type discussed above, which makes asymmetry measurements from dark field images taken in different imaging modes, rather than different illumination modes. A modified illumination aperture plate 113 provides on-axis illumination, just for the sake of example, while field stop 121 takes different forms to select, asymmetrically, the orders of diffracted radiation that will contribute to a dark field image on image sensor 23. Field stop 121 may, for example, take the form shown at 121N for recording the first image (step S2), being changed to the form shown at 121S, for the second measurement (step S3). Therefore, while the +1 order and −1 order beams are both shown in the diagram as chain-dotted rays extending to form a dark field image on sensor 23, only one of these rays is permitted to reach the sensor at each measurement step, the other one being blocked by field stop 121.

In this way, the measurements at steps S2 and S3 are taken using first and second imaging modes in the imaging branch of the scatterometer, rather than by using first and second illumination modes in the illumination branch. SLM 124 is again placed adjacent the field stop 121 in an intermediate pupil plane of the imaging branch of the scatterometer.

As shown in FIG. 8b the incident illumination I and the zero order diffracted radiation 0 in this example are aligned on or close to the optical axis O. The +1 and −1 first order diffraction signals are symmetrically diffracted to angles either side of the optical axis O. In the pupil plane image as projected on sensor 19, these +1 and −1 diffraction orders, which emerge at symmetrically opposite angles with respect to a zero order (specular) ray, are imaged onto separate areas in the pixel array 70 of sensor 19. In the intermediate pupil plane of the image sensor branch, where field stop 121 and SLM 124 are located, again these +1 and −1 diffraction orders appear at different places across the radiation beam.

FIGS. 8c and 8d show alternative forms of aperture plate 121, for use in providing third and fourth imaging modes for analyzing target gratings oriented along a different axis. FIG. 8d shows alternative field stops which combine imaging modes for gratings in two orthogonal directions. The form of these will be recognized as being very similar to that of the aperture plates in FIGS. 3c and 3d. No more detailed description will be provided at this stage.

FIG. 9 illustrates schematically the calibration measurements made using rotated and non-rotated targets under illumination by the aperture plate 113. Asymmetries in the response of the scatterometer are again measured in the pupil plane by sensor 19, and used to derive correction factors f(u, v) by which unit PU can drive SLM 124 to attenuate, to a greater or lesser degree, radiation passing through each pixel position in the intermediate pupil plane in which it is located. Aperture plate 113 with its central aperture gives rise to a zero order image 184 and first order image 184', where the intensities for calibration are measured in steps M1 to M4

When field stop 121 changes between the first and second measurements (first and second imaging modes), it may be noted that the optical paths go through non-overlapping portions of SLM 124. Therefore the pattern applied to SLM 124 to correct for the tool asymmetry need not change between steps S2a and S2b, in this embodiment. Different portions of the SLM 124 can be pre-programmed with the correction factors for the relevant image mode. Portions of the SLM outside the relevant areas need not be programmed at all.

Third Embodiment

FIG. 10 illustrates a third embodiment. This is similar to the embodiment of FIGS. 8a-8d, except that the functions of field stop and SLM have been combined in a single SLM 224. Two alternative states of SLM 224 are labeled 224N and 224S in the diagram. These different states are set up by unit PU as it controls SLM 224, to perform the functions of both the field stop having a north or south aperture, and the attenuation according to correction factors f(u,v), which were calculated for the pixel positions that happened to fall within the aperture required for each mode.

FIG. 11 illustrates at 11a and 11b how different forms of field stop 121 can be used to extend the range of targets and illumination modes for which dark field small target images can be captured. While different forms of field stop can be provided without use of an SLM, the use of the SLM allows any aperture pattern to be programmed without hardware modification, and allows aperture patterns to be switched almost instantaneously, and therefore brings an increased flexibility in practice.

In the example of FIG. 11a, the aperture plate 13 is shown as having the same form as in FIG. 10 and the previous drawings. That is to say, illumination is provided via a central aperture 90, on the optical axis. As is conventional, this form of aperture is characterized by parameters 0.0/0.5 indicating that the open portion is centered at the origin (0.0) and extends half way to the perimeter of the pupil of objective lens 16 (0.5 represents half way). In a middle portion of FIG. 11a is shown an image recorded from pupil image sensor 19 from a target having a certain pitch of grating. The bright circle at the centre of this image represents the zero order diffracted illumination, which naturally is simply reflected back along the optical axis and up to half way in each direction towards the periphery of the pupil. The target used to produce this image is assumed to be a composite target of the type illustrated in FIG. 4. The composite target in this example has both X- and Y-direction grating components, so that four areas of first order diffraction are identified at top and bottom, left and right in the image on sensor 23. The target may for example comprise a pair of X-direction gratings with +d and −d overlay biases, and a pair of Y-direction gratings with +d and −d overlay biases. The target grating may have a pitch of 750 nm, under illumination of wavelength 550 nm, for example.

At the right hand side in FIG. 11a, four alternative forms of field stop 121 are illustrated, each one being adapted to select one of the "free first order" diffraction signals illustrated in the central image. The portions to be selected are referred to as the "free first orders", meaning that they are not superimposed on any other diffraction order.

FIG. 11b shows a second form of aperture plate 13, this time having parameters 0.7/1.0. According to these parameters, the aperture is an annular ring starting 0.7 of the way from the optical axis to the periphery of the pupil and extending all the way to the periphery. The target grating may have a pitch of 500 nm, under illumination of wavelength 550 nm, for example. As indicated by arrow 96, this annular mode of illumination results in a bright annular zero-order portion in the image on sensor 19. Each of the four first order diffraction signals becomes a segment of an annulus, these four segments overlapping with one another and/or with the zero order signal, in the pattern shown. In this arrangement, the four free first order signals appear in relatively small, trapezoidal portions of the image, relatively close to the centre. As illustrated by the arrow 98, aperture plate 121 can take on four different forms, to select each of the three first orders individually.

As in the examples of FIGS. 3b and 8d, other forms of aperture plate can be envisaged, which will simultaneously one of the first orders diffracted in the X direction and another diffracted in the Y direction. As will be envisaged, the ability to provide apertures at these different sizes and shapes in the field stop 121 allows a greater range of diffractions gratings, illumination angles and illumination wavelengths to be exploited, to obtain the best possible measurements of target properties such as overlay. In an embodiment such as that of FIG. 10, where the functions of field stop 121 are implemented by a programmable spatial light modulator such as SLM 224, no real penalty is incurred for providing a wide variety of this field stop patterns, whether in terms of throughput or apparatus size and cost.

Fourth Embodiment

In addition to using the SLM for correction/calibration of difference between optical paths used in different illumination and/or imaging modes, the SLM can be used to implement 'feature extraction' or 'parameter extraction' more directly from the measurements than in the methods described so far. To explain, the methods described above measure asymmetry between complementary diffraction orders (step S4), and from this asymmetry measurement and certain calibrations, another parameter such as overlay is estimated (step S5). In the fourth embodiment, the SLM is programmed with particular spatial variations in intensity that are designed so that the observed asymmetry is directly representative of a parameter of the structure being measured, or the lithographic process more generally. Such a parameter may be focus, for example. Alternatively it could be dose or an illumination parameter as far as the scanner parameters are concerned; and it can be overlay, or side wall angle as far as the feature parameters are concerned. In our published patent publication WO 2010/076232 A2, the contents of which is incorporated herein by reference in its entirety, there is disclosed a method of measuring focus using the asymmetry in the higher orders of the scattered light, caused by an asymmetry in the profile of the printed target such as the different left and right side wall angles (SWAs) of a line structure in the target.

In our published patent application WO 2010/130600 A1, the contents of which is incorporated herein by reference in its entirety, there is disclosed a method of determining the relationship between the measured asymmetry in the scatterometry spectra and the focus. In the method two periodic structures are formed on a substrate by a lithographic apparatus, each structure having at least one feature, such as an asymmetry between opposing sidewall angles, which varies as a different function of the focus of the lithographic apparatus on the substrate. The ratio of the asymmetries for each of the features can be used to determine values for the focus on the substrate, which are independent of the processing conditions for the lithographic apparatus.

In either of the above-mentioned methods, the diffraction spectra in different illumination modes are measured using the pupil image sensor 19, rather than the imaging sensor 23. It has been recognized that machine-learning techniques, including for example principle component analysis, could be applied in the measurement of asymmetry by diffraction based overlay. This could involve defining non-binary weighting patterns across the detected diffraction spectrum, and so enhance sensitivity to desired parameters of interest, like focus, dose and the like, or SWA and the like. However, in the known dark field imaging methods, particularly those using overfilled small targets, the diffraction spectrum is not directly measured or accessible for measurement, and such techniques are at first sight ruled out.

The present inventors have recognized that by placing a spatial light modulator (SLM) in the conjugate pupil plane with a non-binary attenuation pattern, the same principles as in these methods can be applied to dark field imaging-based measurements, including those using a small target. Using machine learning (training) of the SLM pattern by the method of FIG. 12, in conjunction with targets adapted to render focus variations into asymmetry of side wall angle or the like, a selected parameter such as the focus can be measured directly from smaller targets.

Referring to FIG. 12, we see a method according to the fourth embodiment, which is a modified version of the flowchart of FIG. 6 and which may for example be performed using the same apparatus as FIGS. 3*a*-3*d*. Differences from that process are as follows. Step S0, calibrating the SLM to correct for differences in the optical system performance between modes, can still be performed, if desired. In addition, however, new step S0' is performed to calibrate the apparatus with respect to one or more parameters of interest. As mentioned already, these parameters might be such as focus, overlay, or critical dimension or side wall angle.

The relationship between such parameters and the diffraction spectrum is highly complex. Therefore it is not a trivial step to obtain an attenuation pattern that yields a direct readout of focus, for example. However, machine learning techniques such as principal component analysis (PCA) can be applied to a training set of structures & measurements, whereby the optimum attenuation pattern can be evolved and stored for later use. The gratings or other structures themselves, and/or certain processing steps, may be specifically adapted to make the measurement sensitive to the particular parameter or property under study. This training process is the basis of step S0'. It can be performed by providing a training set of targets (on one or more substrates) and repeating the measurement steps S1-S4 or similar, to obtain many different diffraction images in the sensor method of FIG. 6. The training set includes targets varying in various parameters, including the parameter(s) of interest, and whose properties (parameters) are known, either a priori or by other measurement techniques. By selectively attenuating certain parts of the diffraction spectrum in the conjugate pupil plane represented by field stop 21 & SLM 24, the images on sensor 23 can be made more sensitive to variation of asymmetry in certain parameters (e.g. side wall angle), and less sensitive to other parameters (e.g. layer thickness).

Having obtained an attenuation pattern for the specific parameter of interest, this pattern is applied to pixel positions of the SLM 24 in steps S2*a'* and S3*a'*, that also apply any desired correction and/or field stop pattern specific to the illumination mode or imaging modes described with respect to the previous embodiments. (Optionally, these different functions may be assigned to separate SLMs placed in series, each with its own set-up being performed in these steps. Note also that the attenuation can be applied in other conjugate pupil planes, including at the illumination aperture 13.)

Once the pair of images have been obtained with the parameter-specific attenuation pattern, a combined step S4'/S5' is performed to calculate the difference image (as in step S4 of FIG. 6) and directly obtain a value representing the desired parameter (SWA, focus etc.). That is to say, the training process of step S0' and application of the attenuation pattern by SLM 24 in steps S2*a'* and S3*a'* can be performed so that the difference observed between the intensities of the −1 and +1 order images recorded using sensor 23 is substantially a direct measure of the parameter of interest. The separate conversion via a non-linear calibration function (step S5) is no longer needed, or is simplified.

FIG. 13a illustrates a particular illumination mode that will be applied by aperture 13 in an example of the fourth embodiment to be described below. The other apertures can be used, with suitable modification, and the FIG. 13a pattern can be used in variations of the first to third and fifth embodiments described herein. The specific mode of illumination illustrated in FIG. 13a is a symmetric, segmented illumination pattern of a type known from our published patent application US 2010/201963 A1. Two diametrically opposite quadrants, labeled a and b, are bright in this illumination pattern (transparent parts of aperture 13), while the other two quadrants are dark (opaque parts).

FIG. 13b illustrates a diffraction pattern (spectrum) resulting from a simple target grating G, when the illumination pattern provided by aperture has the bright quadrants labeled a and b in FIG. 13a. In this spectrum, in addition to zero order reflections labeled $a_0$ and $b_0$, there are −1 and +1 first order diffraction signals visible, labeled $a_{-1}$, $a_{+1}$, $b_{-1}$ and $b_{+1}$. This diffraction pattern and the manner in which it can be exploited for scatterometry, are described further in the published application US 2010/201963 A1. Briefly, we can note here that, because other quadrants of the illumination aperture are dark, and more generally because the illumination pattern has 180° rotational symmetry, the diffraction orders $a_{-1}$ and $b_{+1}$ are "free", meaning that they do not overlap with the zero order or higher order signals from other parts of the illumination aperture. This property of the segmented illumination pattern can be exploited to obtain clear first order signals from a diffraction grating having a pitch which is half the minimum pitch that could be imaged if a conventional, circularly-symmetric illumination aperture were used. The fact that the separate −1 and +1 diffraction signals are present simultaneously at separate parts of the conjugate pupil plane means that they can be selected using the field stop 21, 121 and/or SLM 24 124, 224, without changing the illumination mode.

Example of Direct Feature Extraction—Focus

In order for the potential and the application of the fourth embodiment to be better understood, we now describe, by way of example, how a parameter such as focus can be measured using on-product targets and using the SLM in the dark field imaging branch of a scatterometer such as the instrument of FIGS. 3a-3d. As an example of a machine-learning technique, Principle Component Analysis will be used. According to Wikipedia, "Principal component analysis (PCA) is a mathematical procedure that uses an orthogonal transformation to convert a set of observations of possibly correlated variables into a set of values of uncorrelated variables called principal components. The number of principal components is less than or equal to the number of original variables. This transformation is defined in such a way that the first principal component has as high a variance as possible (that is, accounts for as much of the variability in the data as possible), and each succeeding component in turn has the highest variance possible under the constraint that it be orthogonal to (uncorrelated with) the preceding components. Principal components are guaranteed to be independent only if the data set is jointly normally distributed. PCA is sensitive to the relative scaling of the original variables." PCA implementation is supported in common mathematical software products such as MATLAB and need not be discussed in detail here. In the well-known MATLAB Statistics Toolbox, for example, the functions "princomp" and "wmspca" give the principal components, while the function "pcares" gives the residuals and reconstructed matrix for a low-rank PCA approximation.

Considering, as a first step, how one would apply PCA in scatterometry using the pupil image sensor 19, we define a pupil coordinate $\bar{v}$ for each pixel of the sensor image. This co-ordinate corresponds effectively to the vector $\vec{K}$ in the description of the first embodiment, above. In the pupil plane image, the i-th PCA component, denoted $PC_i$, of the asymmetry $A(\bar{v})$ at the pupil coordinate $\bar{v}$ is obtained by its projection on the i-th PCA "eigenimage" denoted $E_{TE,TM}^i(\bar{v})$. (Here the subscript denotes whether illumination with TE or TM input polarization is used; this subscript will be dropped in what follows, for simplicity.) In equation form, the PCA components are obtained as follows:

$$PC_i = \int A(\bar{v}) E^i(\bar{v}) d\bar{v}$$
$$= \int [I^{+1st}(\bar{v}) - I^{-1st}(\bar{v})] E^i(\bar{v}) d\bar{v}$$
$$= \int I^{+1st}(\bar{v}) E^i(\bar{v}) d\bar{v} - \int I^{-1st}(\bar{v}) E^i(\bar{v}) d\bar{v}$$

where $I^{\pm 1st}$ denotes the detected intensity of the +1 and −1 diffraction orders in the pupil.

FIG. 14 shows how the same principle is applied in the dark field imaging branch in the method of FIG. 12. Addressing pixels in SLM 24 by co-ordinates (u', v') to address in accordance with the pupil co-ordinate $\bar{v}$, we program SLM 24 in the intermediate pupil-plane with an attenuation pattern that varies, pixel by pixel, in the manner shown. A circle 1300 represents the extent of the pupil in the pupil plane, where SLM 24 is located. A scale at the right hand side shows different transmission levels T, that can be set at individual pixel positions 1302, 1304 in the SLM 24. Not all pixels are drawn individually, and blank areas in the drawing represent pixels that are completely opaque (T=0). Thus SLM 24 in the illustrated state is therefore completely opaque in three quadrants, with a non-binary transmission (attenuation) pattern in the top left quadrant.

The pattern of amplitude transmission for $1^{st}$ order dark-field detection may be programmed for the i-th PCA component according to a function $F^i(\bar{v})$, where:

$$F^i(\bar{v}) = \sqrt{c^i + E^i(\bar{v})}$$

where $c^i$ is a positive constant such that the argument under the square root is positive. The function $F^i(\bar{v})$ is effectively a spatial filter function, and there is one filter function for each measurement step (S2, S3 in FIG. 12). Referring to FIG. 14, it will be seen that the non-opaque pixels 1302, 1304 etc. are grouped in an area 1306 corresponding to the quadrant where the $a_{-1}$ portion of the diffraction spectrum is located, based on the illumination mode and diffraction spectrum illustrated in FIGS. 13a-13b. This particular non-binary transmission (attenuation) pattern establishes a spatial filter function in the optical path leading to image sensor 23. The filter functions for +1 and −1 orders are related via point-symmetry in the pupil-plane (ignoring any corrections included to correct for non-uniform optical path, as in the earlier examples). Thus, while area 1306 represents a filter function for the −1 order, the diametrically opposite area 1306', illustrated in ghost form at 1306', represents a filter function for the b+1 portion of the diffraction spectrum. These different filter functions can be programmed into SLM 24 for the steps S2 and S3, for measuring the −1 and +1 diffraction orders separately.

The i-th PCA component in dark-field mode, denoted $PC_i^{DF}$, is then experimentally obtained by comparing two dark-field measurements, denoted $DF_i^{+1st}$ and $DF_i^{-1st}$, measured by image sensor 23 using these two complementary spatial filter functions. In equation terms:

$$PC_i^{DF} = \int I^{+1st}(\bar{v})[F_{+1st}^i(\bar{v})]^2 d\bar{v} - \int I^{-1st}(\bar{v})[F_{-1st}^i(\bar{v})]^2 d\bar{v}$$
$$= DF_i^{+1st} - DF_i^{-1st}$$

Note that the constant $c^i$ drops out by taking the difference of the two physical dark-field signals. As a result, by using the programmable SLM, we can obtain a PCA filtered signal using the image sensor 23, just as we would using pupil sensor 19 and processing the digitized pupil image. Per PCA component that needs to be acquired, two filter functions have to be programmed on the SLM, and two dark-field image measurements have to be carried out. By PCA based on a training set of targets, these filters may be 'tuned' to deliver a value most sensitive to a parameter of interest, such as focus, and relatively insensitive to process variations and other parameters. Several components may be measured to obtain a better measure of one parameter, and/or to measure more than one parameter of interest.

In summary, we can tune the scatterometer sensor to measure in any feature space that we can create. For example, we can create a feature space such that the sensor reacts in this new space linearly to the target parameter of interest (overlay, focus, dose etc). Thus, inverting the model to estimate this parameter of interest is then trivial and the burden of computation in the measurements is greatly reduced. Note that this idea is not limited to linear basis sets, as implemented by PCA. one could also program the SLM using a non-linear basis set, leading to different pupil-eigenimages onto which to project the original signal. This non-linear basis can be determined from a Support Vector Machine or some other machine-learning kernel method.

In accordance with an embodiment of the present invention there is provided a method of determining the focus of a lithographic apparatus using scatterometry spectra produced from a periodic structure produced on a wafer by the lithographic apparatus. In an embodiment of the invention, the grating is illuminated by a beam having two different beam profiles in respective separate measurement steps, which in combination with a dark field measurement technique in which the zero order diffraction order from the periodic structure is blocked, enables the +1 and −1 order diffraction pattern to be measured in the two separate measurement steps.

In modified versions of the fourth embodiment, the apparatus is modified to use on-axis illumination, as in the embodiments of FIGS. 8a-8d and 10 above, or part-annular illumination as in the embodiments of FIGS. 3 to 7. The same principles of PCA and spatial filtering just described can be applied in the SLM 124 or 224 as in the SLM 24. However, the shapes of the filter functions in the SLM pixel array would be different, in accordance with the different shape of the spectrum, as well as being different according to the parameter of interest and the principle component or other analysis method.

Fifth Embodiment

FIG. 15 illustrates a fifth embodiment of the invention. This is the same as the third embodiment (FIG. 10), except that SLM 224 which is of a transmissive type, has been replaced by SLM 324 which is of a reflective type. That is to say, while the SLMs 24, 124 and 224 in the previous embodiments have attenuated radiation in the intermediate pupil plane while transmitting that radiation in a straight line, SLM 324 comprises an array of reflective pixel elements, which are controllable by unit PU to vary the intensity with which each pixel is reflected. Because the beams in the region between lenses 20 and 22 in the imaging branch of the scatterometer are parallel, a reflective element such as SLM 324 can be included to change the direction of the beam, without distorting or mixing the diffraction signals. As illustrated on the lower right hand side of FIG. 14, the pattern applied to the SLM to form apertures and correction values may need to be distorted (stretched), in accordance with its oblique orientation in the beam.

Spatial Light Modulator Implementations

Various forms of SLM may be envisaged, and the ability to use the either transmissive and/or reflective forms of SLM provides a variety of options for practical embodiments, including not only the ones described above but also further optical path layouts and combinations. Transmissive types of SLM may be, for example, a well-known liquid crystal device or a newer "electronic ink" device of type described as a "variable filter" in US 2006/245092A. Another published patent application, US 2006/109435A proposes to use such as a cell as the patterning device in a lithographic apparatus. "Electronic ink" devices are broadly to be understood as the type in which the distribution of two immiscible fluids, or a mixture of fluids and solids, is controlled by electrical signals to vary the optical performance of a cell in a pixel array. The two materials present in each cell are selected so that they differ usefully in their optical properties. They may differ for example in their opacity or reflectivity, or in their refractive index. The technologies described and applied in those other patent applications can be adapted to serve as the SLM in an embodiment of the present invention.

While liquid crystal devices are longer established and more widely available for use as SLMs than electronic ink devices, LC devices generally affect the polarization of the transmitted light. Therefore, if LC devices are used as SLM 24, 124 or 224 in embodiments of the present invention, attention will need to be given to polarization behavior, in order to avoid distortion of the measurement results being introduced by the SLM.

With regard to reflective SLM 324, again, electronic ink technologies may be useful, but also a very common and readily available form of reflective SLM is the deformable mirror device (DMD) based on and array of micro-mirror devices. In such devices, each pixel location is provided with one or more tiny mirrors which can be moved in accordance with a pixel value. Depending on the orientation of each pixel mirror, radiation arriving at that pixel position on SLM 324 will either be reflected along the ray paths indicated, to the image sensor 23, or directed elsewhere, and effectively blocked. As illustrated in FIG. 12, SLM 324 is arranged to transmit one or other of the first orders using the aperture pattern of 324N, 324S etc., while blocking the zero order diffraction signal, which arrives along the optical axis. Again, the SLM 324 can be controlled to provide an almost infinite variety of aperture patterns, so as to select the free first orders from the diffraction signals from a variety of grating targets, under a variety of illumination angles.

For devices such as a DMD, each pixel generally performs as a binary element, either reflecting radiation along the imaging path or not, according to the pixel value. For the purposes of applying the correction factors f(u,v) and/or filter function $F^i(\bar{v})$ across the intermediate pupil plane, such a device may be operated in one or more multiplexing modes to achieve a more finely variable attenuating level. Time multiplexing is one method that can be used to do this. That is to say, a given pixel can be turned on and off rapidly, with a duty cycle corresponding to the correction/filter factor desired. Where the number of pixels in the micro-mirror array is significantly greater than the resolution of the correction/filtering pattern, spatial averaging, for example by dithering, can be applied, instead of or in addition to time modulation. For example, a group of four or eight pixels might be controlled together to achieve a desired average correction factor/filter weighting across their combined area.

In embodiments where the functions of field stop and correction/filtering are both performed by SLMs, they may be performed by a single SLM, as illustrated by SLM 224 and 324, for example, or they may be performed by separate SLMs, each specialized to its particular function. For example, an SLM which is designed to provide very fine control of the attenuation, in accordance with a desired correction/filter factor, may have a performance which is not so ideal to serve as a binary aperture device such as the field stop. Alternative embodiments are therefore possible in which the functions of field stop and correction/filtering are performed by separate SLMs, each designed for that purpose, and arranged in a series in the optical path leading to image sensor 23. These two SLMs may be both transmissive, both reflective, or one reflective and one transmissive. The principles of the invention are not affected by such variations.

Conclusion:

The corrections taught by the first to third embodiments above enable enhanced throughput of the dark field overlay measurement while maintaining the correctness of the measured overlay value. This is achieved by correcting tool-induced asymmetry, while using opposite illumination angles or imaging angles without any substrate rotation. The use of small targets allows simultaneous readout of two or gratings at different positions within the illumination spot. Coupled with other techniques to reduce position-dependence of the measured overlay, described in a co-pending patent application mentioned above, these measures allow accurate overlay measurements with a greatly increased throughput.

Filter functions taught by the fourth embodiment enable enhanced selectivity of the parameters of interest, and can be tuned to yield direct measurements of the parameter of interest. With appropriate design of the target structures and patterning devices used to produce them, parameters such as focus or dose may become directly measurable.

While specific embodiments of the invention have been described above, it will be appreciated that the invention may be practiced otherwise than as described.

The techniques described above can be performed to calibrate and then correct the intensity measurements, according to the performance of the tool optical system in different modes of illumination and/or imaging. If the measurement process uses different wavelengths and/or polarizations of radiation, then calibration can be performed for these separately. Similar considerations apply where the process is calibrated with filter function for different parameters of interest.

While the inspection apparatus or tool illustrated in the embodiments comprises a particular form of scatterometer having first and second branches for simultaneous imaging of pupil plane and substrate plane by parallel image sensors, alternative arrangements are possible. Rather than provide two branches permanently coupled to objective lens 16 with beam splitter 17, the branches could be coupled selectively by a movable optical element such as a mirror. The optical system could be made having a single image sensor, the optical path to the sensor being is reconfigured by movable elements to serve as a pupil plane image sensor and then a substrate plane image sensor.

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed.

In association with the physical presence of a suitable SLM in the imaging branch and suitable grating structures of the targets as realized on substrates and patterning devices, an embodiment may include a computer program containing one or more sequences of machine-readable instructions describing a methods of producing targets on a substrate, measuring targets on a substrate and/or analyzing measurements to obtain information about a lithographic process. This computer program may be executed for example within controller PU in the apparatus of FIGS. 3a-3d and/or the control unit LACU of FIG. 2. There may also be provided a data storage medium (e.g., semiconductor memory, magnetic or optical disk) having such a computer program stored therein.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:
   using a lithographic process to form a periodic structure on a substrate;
   a first measurement comprising detecting a first image of the periodic structure, while illuminating the structure with a first beam of radiation, the first image being formed using a first selected part of diffracted radiation;
   a second measurement comprising detecting a second image of the periodic structure, while illuminating the structure with a second beam of radiation, the second image being formed using a second selected part of the diffracted radiation which is symmetrically opposite to the first part, in a diffraction spectrum of the periodic structure;
   using a difference in intensity values derived from the detected first and second images together to determine a property of the periodic structure; and
   controlling a spatial light modulator to apply a varying non-binary optical attenuation over the first and second selected parts of the diffracted radiation prior to detecting the first and second images respectively.

2. The method of claim 1, wherein:
   the first and second measurements are performed without rotating the substrate using different optical paths within a measurement optical system, and
   the varying optical attenuation is configured to reduce an influence on the determined property of the difference in optical paths between the first and second measurements.

3. The method of claim 2, wherein a plurality of different patterns of varying attenuation are defined and associated with different available optical paths, the method further comprising:
   selecting automatically an attenuation pattern according to the optical path used in each of the measurements and controlling the spatial light modulator to apply the selected attenuation pattern to the diffracted radiation.

4. The method of claim 2, wherein:
   the first and second measurements are performed using respectively a first and a second illumination mode of the measurement optical system, such that the first and second beams of radiation are incident on the periodic structure from symmetrically opposed angles relative to an optical axis of the measurement optical system, without rotating the substrate relative to the measurement optical system, and
   at least first and second attenuation patterns are defined to compensate for asymmetry between optical paths defining the first and second illumination modes.

5. The method of claim 2, wherein the first and second measurements are performed using respectively a first and a second imaging mode of the measurement optical system, such that the first and second images are formed using portions of radiation diffracted by the periodic structure to diametrically opposed angles relative to an optical axis of the measurement optical system, without rotating the substrate relative to the measurement optical system, the selected part of the diffracted radiation passing through different parts of the spatial light modulator in the first and second imaging modes.

6. The method of claim 2, further comprising:
   a calibration wherein a pattern for attenuation is at least partially determined using the results of a plurality of calibration measurements performed on a substrate, which is measured at different rotations through each of the optical paths.

7. The method of claim 6, wherein the calibration measurements are performed using an image sensor which is located in a conjugate pupil plane of the optical system.

8. The method of claim 6, wherein the calibration measurements are performed using a calibration target having a periodic structure larger than a field of view of the measurement optical system.

9. The method of claim 1, wherein the varying optical attenuation implements first and second filter functions for the respective measurement step, the filter functions being calculated to enhance sensitivity of the calculated difference to a property of interest.

10. The method of claim 9, further comprising implementing a machine-learning process to derive the filter functions from measurements of a training set of structures.

11. The method of claim 10, wherein the machine-learning process comprises principal component analysis.

12. The method of claim 9, wherein the filter functions are calculated such that the calculated difference is related directly to the performance parameter of the lithographic process, rather than a feature of the periodic structure itself.

13. The method of claim 1, wherein the lithographic process is an optical lithography process and is performed so that asymmetry between side wall angles in the periodic structure is sensitive to focus variation in the lithographic process.

14. The method of claim 1, wherein the lithographic process is performed so that a certain asymmetry of profile of the periodic structure is made sensitive to a particular performance parameter of the lithographic process.

15. The method of claim 1, wherein the periodic structure occupies less than half the area of the field of view such that first or second images of a plurality of periodic structures formed and detected simultaneously.

16. The method of claim 1, wherein a correction is applied to at least one of the detected first and second images and the measured asymmetry, based at least in part on the position of the periodic structure within a field of view of the measurement optical system.

17. The method of claim 1, wherein the spatial light modulator is used also in the selection of the first and second parts of the diffracted radiation.

18. A method of manufacturing devices comprising:
 a device pattern is applied to a series of substrates using a lithographic process;
 inspecting at least one periodic structure formed as part of or beside the device pattern on at least one of the substrates using an inspection method comprising:
  using a lithographic process to form a periodic structure on a substrate;
  a first measurement comprising detecting a first image of the periodic structure, while illuminating the structure with a first beam of radiation, the first image being formed using a first selected part of diffracted radiation;
  a second measurement comprising detecting a second image of the periodic structure, while illuminating the structure with a second beam of radiation, the second image being formed using a second selected part of the diffracted radiation which is symmetrically opposite to the first part, in a diffraction spectrum of the periodic structure;
  using a difference in intensity values derived from the detected first and second images together to determine a property of the periodic structure; and
 controlling a spatial light modulator to apply a varying non-binary optical attenuation over the first and second selected parts of the diffracted radiation prior to detecting the first and second images respectively; and
 controlling the lithographic process for later substrates in accordance with the result of the inspection method.

* * * * *